United States Patent
Sutardja

(10) Patent No.: US 7,638,870 B2
(45) Date of Patent: Dec. 29, 2009

(54) PACKAGING FOR HIGH SPEED INTEGRATED CIRCUITS

(75) Inventor: Sehat Sutardja, Los Altos Hills, CA (US)

(73) Assignee: Marvell International Ltd., Hamilton (BM)

( * ) Notice: Subject to any disclaimer, the term of this patent is extended or adjusted under 35 U.S.C. 154(b) by 367 days.

(21) Appl. No.: 11/473,702

(22) Filed: Jun. 23, 2006

(65) Prior Publication Data

US 2007/0018305 A1    Jan. 25, 2007

Related U.S. Application Data

(63) Continuation of application No. 11/248,985, filed on Oct. 12, 2005.

(60) Provisional application No. 60/722,272, filed on Sep. 30, 2005, provisional application No. 60/701,701, filed on Jul. 22, 2005.

(51) Int. Cl.
 *H01L 23/48* (2006.01)
 *H01L 21/00* (2006.01)

(52) U.S. Cl. ............... 257/690; 257/776; 257/784; 257/E23.046; 257/E23.152; 438/123; 438/129

(58) Field of Classification Search ............... None
See application file for complete search history.

(56) References Cited

U.S. PATENT DOCUMENTS

| 3,757,028 | A | * | 9/1973 | Schlessel | 174/33 |
| 5,039,824 | A | * | 8/1991 | Takashima et al. | 174/33 |
| 5,208,782 | A | | 5/1993 | Sakuta et al. | |
| 5,340,771 | A | * | 8/1994 | Rostoker | 29/827 |
| 5,430,247 | A | * | 7/1995 | Bockelman | 174/33 |
| 5,457,340 | A | | 10/1995 | Templeton et al. | |
| 5,646,368 | A | | 7/1997 | Muyshondt et al. | |
| 5,646,451 | A | | 7/1997 | Freyman et al. | |
| 5,650,659 | A | | 7/1997 | Mostafazadeh et al. | |
| 5,871,655 | A | * | 2/1999 | Lee et al. | 216/22 |

(Continued)

FOREIGN PATENT DOCUMENTS

JP    60 018944    1/1985

(Continued)

OTHER PUBLICATIONS

IC Packaging Catalot 2001; Advanced Semiconductor Engineering, Inc.; 2001; 6 pages.

(Continued)

*Primary Examiner*—Alonzo Chambliss

(57) ABSTRACT

An integrated circuit package comprises an integrated circuit die comprising N adjacent pads, where N is an integer greater than three. A substrate comprises a first pair of traces including first and second traces and a second pair of traces including third and fourth traces. The first, second, third and fourth traces include first ends spaced from the integrated circuit die and second ends adjacent to the integrated circuit die. The first and second pairs of traces carry differential signals. The third trace of the second pair of traces has a first polarity and the fourth trace of the second pair of traces has a second polarity. The third trace is located on one side of the fourth trace at the first end and is located on an opposite side of the fourth trace at the second end. N connections independently connect the second ends to N pads.

37 Claims, 17 Drawing Sheets

U.S. PATENT DOCUMENTS

| | | | |
|---|---|---|---|
| 6,317,325 | B1 | 11/2001 | Patel et al. |
| 6,373,740 | B1 | 4/2002 | Forbes et al. |
| 6,462,404 | B1 | 10/2002 | Schoenfeld |
| 6,538,336 | B1 | 3/2003 | Secker et al. |
| 6,567,413 | B1 | 5/2003 | Denton et al. |
| 6,649,832 | B1 | 11/2003 | Brophy et al. |
| 6,747,341 | B2 | 6/2004 | Knapp et al. |
| 6,812,580 | B1 | 11/2004 | Wenzel et al. |
| 6,992,377 | B2 * | 1/2006 | Zhou et al. .................. 257/692 |
| 7,049,694 | B2 * | 5/2006 | Zhou et al. .................. 257/692 |
| 7,271,985 | B1 * | 9/2007 | Buhler et al. ............ 360/245.9 |
| 7,420,286 | B2 | 9/2008 | Kramer |
| 2002/0140112 | A1 | 10/2002 | Pon |
| 2003/0110339 | A1 | 6/2003 | Calvignac et al. |
| 2003/0220018 | A1 | 11/2003 | Winings et al. |
| 2004/0000702 | A1 | 1/2004 | Knapp et al. |
| 2005/0017352 | A1 | 1/2005 | Lee |
| 2005/0121766 | A1 * | 6/2005 | Devnani et al. ............. 257/691 |
| 2005/0189643 | A1 | 9/2005 | Zhou et al. |
| 2006/0113665 | A1 * | 6/2006 | Lee et al. .................... 257/734 |
| 2008/0116988 | A1 * | 5/2008 | Blair et al. ..................... 333/1 |
| 2008/0258315 | A1 | 10/2008 | Okuma |

FOREIGN PATENT DOCUMENTS

| | | |
|---|---|---|
| JP | 62 140446 | 6/1987 |
| JP | 04-091463 | 3/1992 |
| JP | 04-094569 | 3/1992 |
| JP | 05 235245 | 9/1993 |
| JP | 06-177312 A | 6/1994 |
| JP | 08-070090 | 3/1996 |
| JP | 2003-068780 | 3/2003 |
| WO | WO 95/06946 | 3/1995 |

OTHER PUBLICATIONS

Official Action including the Search Report and Written Opinion from the Intellectual Property Office of Singapore dated Aug. 10, 2007 for Application No. SG 200604689-0; 11 pages.

Official Action including the Search Report and Written Opinion from the Intellectual Property Office of Singapore dated Aug. 14, 2007 for Application No. SG 200604685-8; 9 pages.

Partial translation of Kikuchi, JP 06177312 A, paragraph [0003].

Machine translation of Kikuchi, JP 06177312 A.

Official Action including the Search Report and Written Opinion from the European Patent Office dated Apr. 21, 2009 for Application No. 06014259.3- 1235/1746649; 11 pages.

Official Communication from the European Patent Office dated Apr. 16, 2009 for Application No. 06014260.1 - 1235/1746650; 6 pages.

Shirai et al, "The Technology for Over 300-pin QFPs," Electronic Components and Technology Conference, 1992. Proceedings., 42nd, May 1992, pp. 423-428.

* cited by examiner

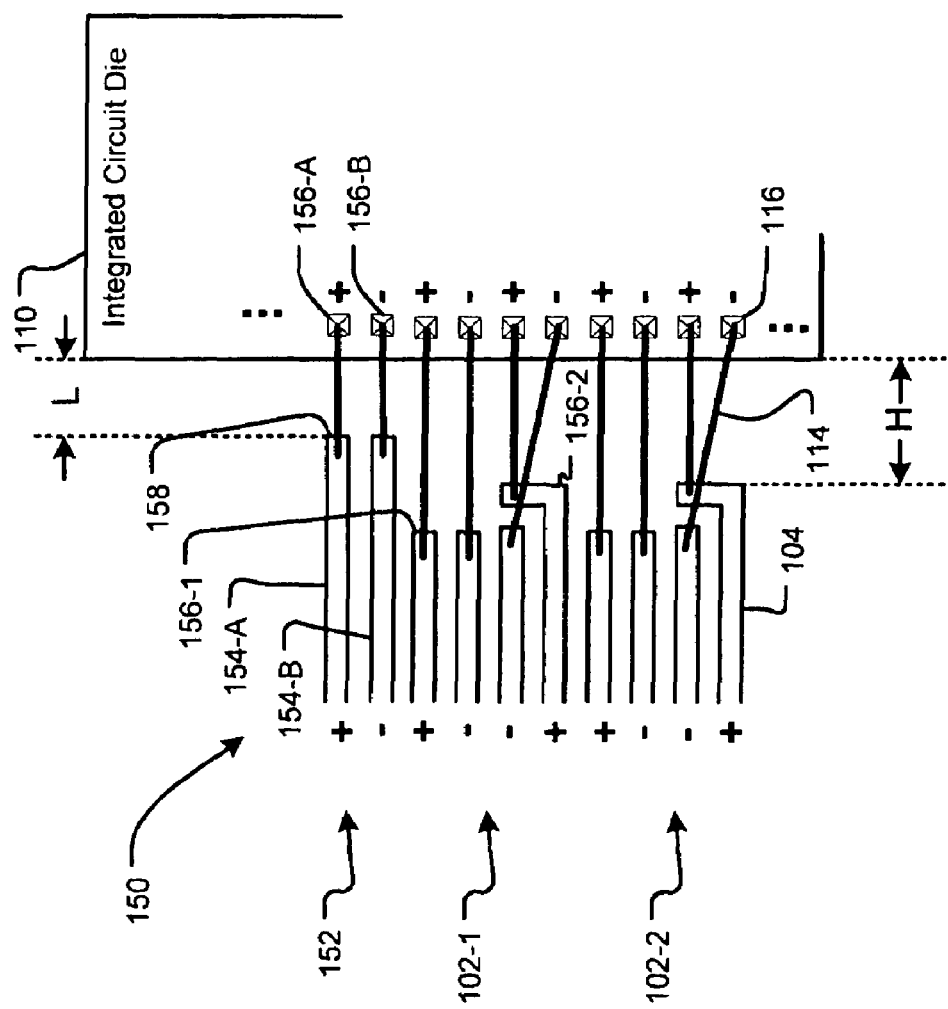

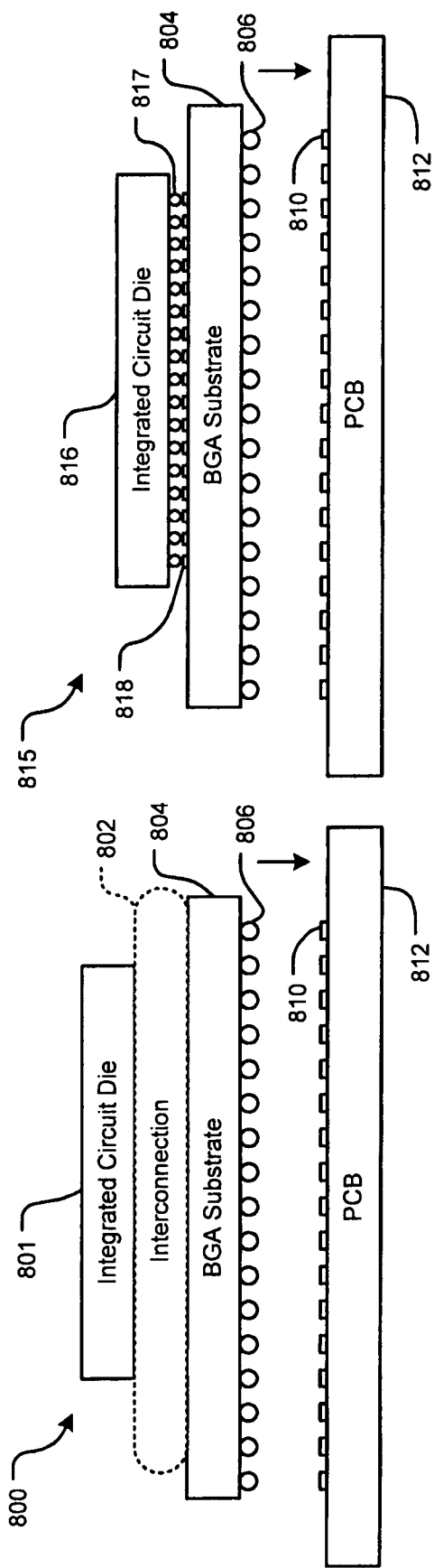
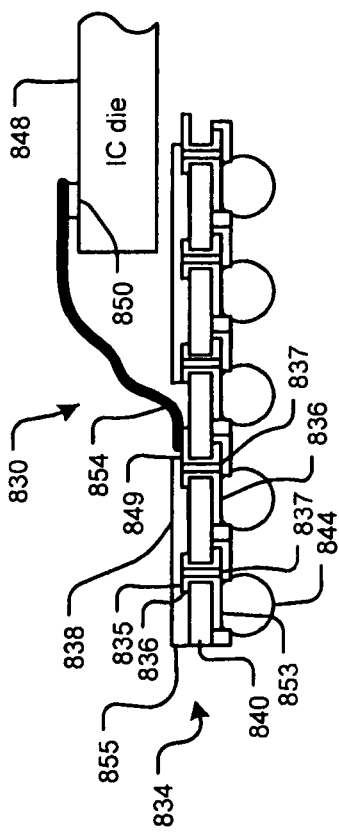

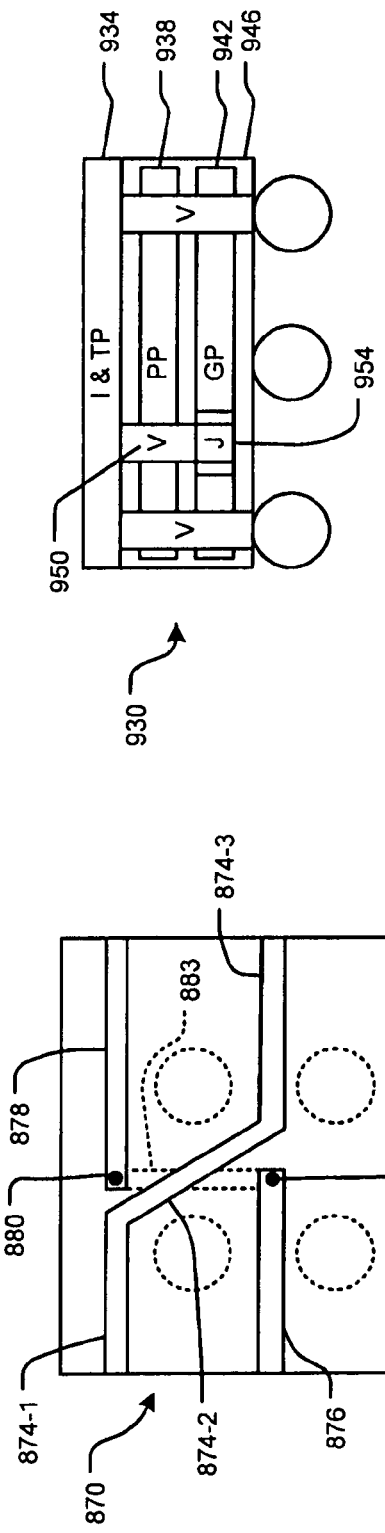
FIG. 15A
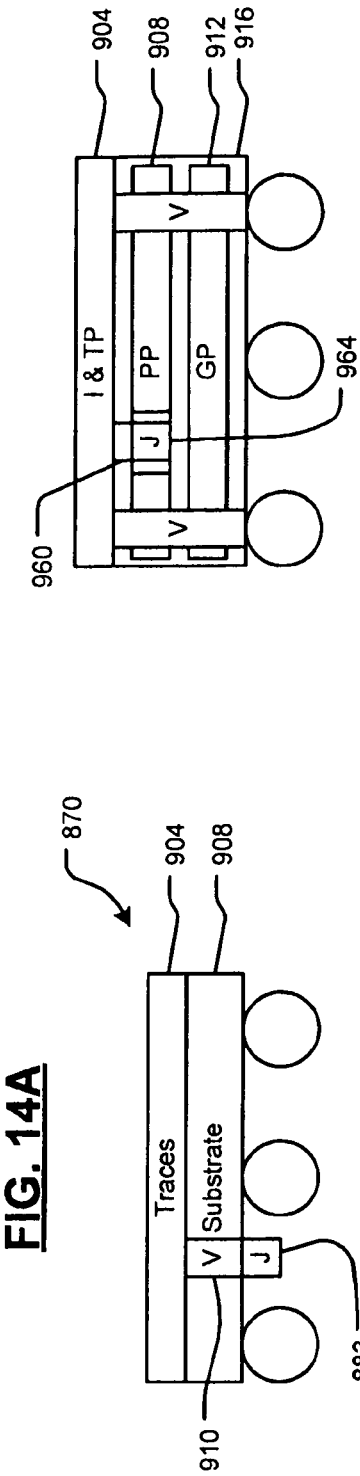
FIG. 15B
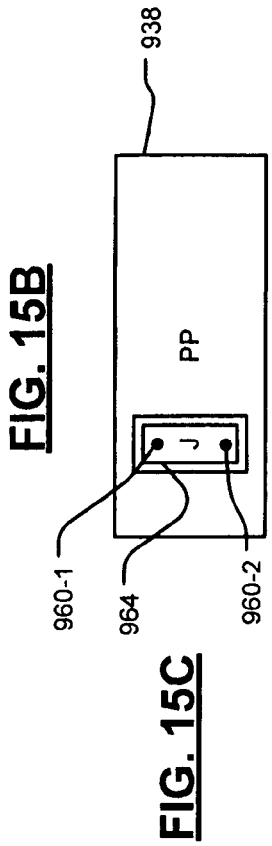
FIG. 15C
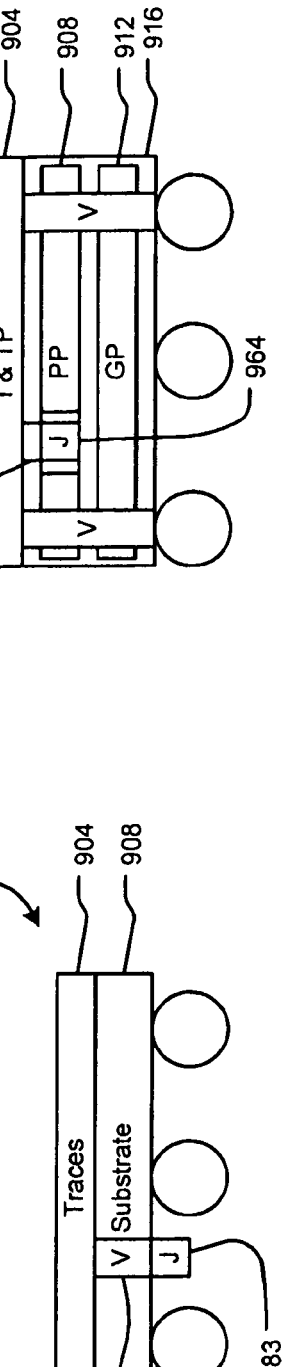
FIG. 14A
FIG. 14B

PACKAGING FOR HIGH SPEED INTEGRATED CIRCUITS

CROSS-REFERENCE TO RELATED APPLICATIONS

This application is a continuation of U.S. patent application Ser. No. 11/248,985 filed on Oct. 12, 2005, and claims the benefit of U.S. Provisional Application Nos. 60/722,272, filed on Sep. 30, 2005 and 60/701,701, filed on Jul. 22, 2005. The disclosures of the above applications are incorporated herein by reference in its entirety.

FIELD OF THE INVENTION

The present invention relates to packaging for integrated circuits (ICs), and more particularly high speed packaging for ICs.

BACKGROUND OF THE INVENTION

Modern integrated circuits (ICs) typically employ differential signaling. In differential signaling, a signal is conveyed between two separate, active conductors instead of one active conductor and ground. The magnitude of the differential signal is the difference between the two signals rather than the voltages between the two individual signals and ground.

To transmit or receive differential signals to or from an IC, the differential signals are transmitted over a pair of conductors of a lead frame. Referring now to FIGS. 1-2, exemplary packages 10 and 10' are shown to include an integrated circuit die 12 having pads 14 that are connected by bondwires 16 to leads 20 of a lead frame 24. The packages 10 and 10' are typically encased in a suitable protective material 24.

Referring now to FIG. 3, differential signal pairs 50-1, 50-2 and 50-3 are connected by leads 20-1A and 20-1B, 20-2A and 20-2B, and 20-3A and 20-3B and bondwires 16-1A and 16-1B, 16-2A and 16-2B, and 16-3A and 16-3B, respectively, to pads 14-1A and 14-1B, 14-2A and 14-2B, and 14-3A and 14-3B, respectively, of the integrated circuit die 12. In each differential pair in FIG. 3, the notation A represents a first polarity conductor and the notation B represents a second polarity conductor, respectively.

Adjacent differential pairs are typically located in close proximity to one another. In some circumstances, the differential pairs may be situated with a first polarity conductor of one pair located immediately adjacent to a second polarity conductor of the same pair on one side and with a second polarity conductor of another pair on the opposite side. Pair coupling tends to occur between adjacent high speed differential signals. For example, pair coupling tends to occur at 60 and 62 in FIG. 3. The magnitude of the difference between the signals carried on the adjacent pairs tends to cause data errors and/or to reduce design margins to an unacceptable level particularly for high speed signals such as Gigabit per second and higher data rates. The pair coupling problem tends to be even greater for low cost plastic lead frames as compared to ball grid array (BGA) packaging with a ground plane shield.

SUMMARY OF THE INVENTION

An integrated circuit package comprises an integrated circuit die comprising a first pad, a second pad adjacent to the first pad, a third pad adjacent to the second pad, and a fourth pad adjacent to the third pad. A lead frame comprises a first lead, a second lead adjacent to the first lead, a third lead adjacent to the second lead, and a fourth lead adjacent to the third lead, wherein a first end of the fourth lead extends beyond at least one of the first, second, and third leads and in a direction towards a path defined by the third lead. First, second, third and fourth bondwires connect the first, second, fourth and third leads to the first, second, third and fourth pads, respectively.

In other features, the first lead carries a signal having a first polarity, the second lead carries a signal having a second polarity, the third lead carries a signal having the second polarity and the fourth lead carries a signal having the first polarity, wherein the first and second polarities are opposite polarities. The leads of the lead frame carry high speed differential signals. The high speed signals have a frequency greater than or equal to 1 Gigabit per second (Gb/s). The first, second, third and fourth leads are spaced at least a first distance from the integrated circuit die and the lead frame further comprises fifth and sixth leads that are spaced a second distance from the integrated circuit die, wherein the first distance is greater than the second distance.

In other features, fifth and sixth bondwires connect fifth and sixth leads to fifth and sixth pads. The first, second, third and fourth bondwires have a first length and the fifth and sixth bondwires have a second length and wherein the second length is shorter than the first length. The fifth and sixth leads carry signals having a first speed and wherein the first, second, third and fourth leads carry signals having a second speed that is higher than the first speed.

In other features, the integrated circuit package includes a high speed serializer/deserializer (SERDES). The first and second pads of the integrated circuit die are associated with differential transmit signals of the SERDES and the third and fourth pads of the integrated circuit die are associated with differential receive signals of the SERDES.

In other features, a network interface comprises the integrated circuit package. The network interface is Ethernet compliant and operates at speeds greater than 1 Gigabit per second. The first bondwire comprises first and second bondwires that are stacked and connected between the first lead and the first pad and the fifth pad, respectively, of the integrated circuit die. The first, second, third and fourth bondwires each comprise first and second stacked bondwires.

A method of providing an integrated circuit package comprises creating a first pad, a second pad adjacent to the first pad, a third pad adjacent to the second pad, and a fourth pad adjacent to the third pad on an integrated circuit die; using a lead frame comprising a first lead, a second lead adjacent to the first lead, a third lead adjacent to the second lead, and a fourth lead adjacent to the third lead; extending a first end of the fourth lead beyond at least one of the first, second, and third leads and in a direction towards a path defined by the third lead; and providing first, second, third and fourth bondwires connecting the first, second, fourth and third leads to the first, second, third and fourth pads, respectively.

In other features, the method comprises using the first lead to carry a signal having a first polarity, the second lead to carry a signal having a second polarity, the third lead to carry a signal having the second polarity and the fourth lead to carry a signal having the first polarity. The first and second polarities are opposite polarities. The method comprises using the leads of the lead frame to carry high speed differential signals. The high speed signals have a frequency greater than or equal to 1 Gigabit per second (Gb/s).

In other features, the method comprises spacing the first, second, third and fourth leads at least a first distance from the integrated circuit die; and providing fifth and sixth leads on the lead frame that are spaced a second distance from the integrated circuit die, wherein the first distance is greater than the second distance. The method comprises providing fifth and sixth leads; creating fifth and sixth pads on the integrated circuit die; connecting the fifth and sixth leads to the fifth and sixth pads using fifth and sixth bondwires. The first, second, third and fourth bondwires have a first length and the fifth and sixth bondwires have a second length and wherein the second length is shorter than the first length.

In still other features, the method comprises using the fifth and sixth leads to carry signals having a first speed; and using the first, second, third and fourth leads to carry signals having a second speed that is higher than the first speed. The method comprises creating a fifth pad on the integrated circuit die; using first and second stacked bondwires that are stacked and connected between the first lead and the first pad and the fifth pad, respectively, of the integrated circuit die for the first bondwire. The first, second, third and fourth bondwires each comprise first and second stacked bondwires.

An integrated circuit package comprises integrated circuit die means for performing a function comprising first connecting means for providing a first connection surface, second connecting means for providing a second connection surface adjacent to the first connecting means, third connecting means for providing a third connection surface adjacent to the second connecting means, and fourth connecting means for providing a fourth connection surface adjacent to the third connecting means. Frame means comprises first conducting means for conducting, second conducting means for conducting adjacent to the first conducting means, third conducting means for conducting adjacent to the second conducting means, and fourth conducting means for conducting adjacent to the third conducting means. The first end of the fourth conducting means extends beyond at least one of the first, second, and third conducting means and in a direction towards a path defined by the third conducting means. First, second, third and fourth wire means connect the first, second, fourth and third conducting means to the first, second, third and fourth connecting means, respectively.

In other features, the first conducting means carries a signal having a first polarity, the second conducting means carries a signal having a second polarity, the third conducting means carries a signal having the second polarity and the fourth conducting means carries a signal having the first polarity. The first and second polarities are opposite polarities. The conducting means of the frame means carries high speed differential signals. The high speed signals have a frequency greater than or equal to 1 Gigabit per second (Gb/s). The first, second, third and fourth conducting means are spaced at least a first distance from the integrated circuit die means and the frame means further comprises fifth and sixth conducting means that are spaced a second distance from the integrated circuit die means. The first distance is greater than the second distance.

In other features, fifth and sixth wire means connect fifth and sixth conducting means to fifth and sixth connecting means, wherein the first, second, third and fourth wire means have a first length and the fifth and sixth wire means have a second length. The second length is shorter than the first length. The fifth and sixth conducting means carry signals having a first speed. The first, second, third and fourth conducting means carry signals having a second speed that is higher than the first speed.

In other features, the integrated circuit package includes high speed serializer/deserializer (SERDES) means for serializing and deserializing. The first and second connecting means of the integrated circuit die means are associated with differential transmit signals of the SERDES means and the third and fourth connecting means of the integrated circuit die means are associated with differential receive signals of the SERDES means.

A network interface comprises the integrated circuit package. The network interface is Ethernet compliant and operates at speeds greater than 1 Gigabit per second. In other features fifth connecting means provides a connection surface on the integrated circuit die means. The first wire means comprises first and second stacked wire means for connecting that are stacked and connected between the first conducting means and the first connecting means and the fifth connecting means, respectively, of the integrated circuit die means. The first, second, third and fourth wire means each comprise first and second stacked wire means for connecting.

A lead frame for an integrated circuit die comprises a first lead, a second lead adjacent to the first lead, a third lead adjacent to the second lead, and a fourth lead adjacent to the third lead. A first end of the fourth lead extends beyond at least one of the first, second, and third leads and in a direction towards a path defined by the third lead.

In other features, the first lead carries a signal having a first polarity, the second lead carries a signal having a second polarity, the third lead carries a signal having the second polarity and the fourth lead carries a signal having the first polarity, wherein the first and second polarities are opposite polarities. The leads of the lead frame carry high speed differential signals. The high speed signals have a frequency greater than or equal to 1 Gigabit per second (Gb/s).

In yet other features, the first, second, third and fourth leads are spaced at least a first distance from the integrated circuit die and the lead frame further comprises fifth and sixth leads that are spaced a second distance from the integrated circuit die. The first distance is greater than the second distance. The fifth and sixth leads carry signals having a first speed. The first, second, third and fourth leads carry signals having a second speed that is higher than the first speed. The fourth lead is generally "L"-shaped.

A method for providing a lead frame for an integrated circuit die comprising locating a second lead adjacent to a first lead; locating a third lead adjacent to the second lead; locating a fourth lead adjacent to the third lead; and extending a first end of the fourth lead beyond at least one of the first, second, and third leads and in a direction towards a path defined by the third lead.

In other features, the method comprises using the first lead to carry a signal having a first polarity, the second lead to carry a signal having a second polarity, the third lead to carry a signal having the second polarity and the fourth lead to carry a signal having the first polarity, wherein the first and second polarities are opposite polarities. The first and second and third and fourth leads of the lead frame carry high speed differential signals. The high speed signals have a frequency greater than or equal to 1 Gigabit per second (Gb/s). The method comprises spacing the first, second, third and fourth leads at least a first distance from the integrated circuit die; and locating fifth and sixth leads a second distance from the integrated circuit die. The first distance is greater than the second distance.

In other features, the method comprises using the fifth and sixth leads carry signals having a first speed; and using the first, second, third and fourth leads carry signals having a second speed that is higher than the first speed. The fourth lead is generally "L"-shaped.

A lead frame for an integrated circuit die comprising first conducting means for conducting, second conducting means for conducting adjacent to the first conducting means, third conducting means for conducting adjacent to the second conducting means, and fourth conducting means for conducting adjacent to the third conducting means. A first end of the fourth conducting means extends beyond at least one of the first, second, and third conducting means and in a direction towards a path defined by the third conducting means.

In other feature, the first conducting means carries a signal having a first polarity, the second conducting means carries a signal having a second polarity, the third conducting means carries a signal having the second polarity and the fourth conducting means carries a signal having the first polarity, wherein the first and second polarities are opposite polarities. The conducting means of the lead frame carries high speed differential signals. The high speed signals have a frequency greater than or equal to 1 Gigabit per second (Gb/s).

In other features, the first, second, third and fourth conducting means are spaced at least a first distance from the integrated circuit die and the lead frame further comprises fifth and sixth conducting means for conducting that are spaced a second distance from the integrated circuit die, wherein the first distance is greater than the second distance. The fifth and sixth conducting means carry signals having a first speed and wherein the first, second, third and fourth conducting means carry signals having a second speed that is higher than the first speed. The fourth conducting means is generally "L"-shaped.

An integrated circuit package comprises an integrated circuit die comprising at least four pads that at least one of transmit and receive differential signals. A lead frame comprises at least four leads. At least four bondwires connect the leads to the pads. A set of polarities of adjacent signals carried by the at least four leads is different than a set of polarities of adjacent signals carried by the bondwires and the pads.

In other features, a first lead carries a signal having a first polarity, a second lead is adjacent to the first lead and carries a signal having a second polarity, a third lead is adjacent to the second lead and carries a signal having the second polarity and a fourth lead is adjacent to the third lead and carries a signal having the first polarity. A first pad carries a signal having the first polarity, a second pad is adjacent to the first pad and carries a signal having a second polarity, a third pad is adjacent to the second pad and carries a signal having the first polarity and a fourth pad is adjacent to the third pad and carries a signal having the second polarity, and wherein the first and second polarities are opposite polarities. The leads of the lead frame carry high speed differential signals. The high speed signals have a frequency greater than or equal to 1 Gigabit per second (Gb/s).

In other features, the four leads are spaced at least a first distance from the integrated circuit die and the lead frame further comprises fifth and sixth leads that are spaced a second distance from the integrated circuit die. The first distance is greater than the second distance. Fifth and sixth bondwires connect fifth and sixth leads to fifth and sixth pads. The first, second, third and fourth bondwires have a first length and the fifth and sixth bondwires have a second length and wherein the second length is shorter than the first length. The fifth and sixth leads carry signals having a first speed and wherein the four leads carry signals having a second speed that is higher than the first speed.

In other features, the integrated circuit package comprises a high speed serializer/deserializer.

In other features, a network interface comprises the integrated circuit package. The network interface is Ethernet compliant at speeds greater than 1 Gigabit per second. A fifth pad is located on the integrated circuit die. The first bondwire comprises first and second bondwires that are stacked and connected between the first lead and the first pad and the fifth pad, respectively, of the integrated circuit die. The first, second, third and fourth bondwires each comprise first and second stacked bondwires.

A method for providing an integrated circuit package comprises providing an integrated circuit die comprising at least four pads that at least one of transmit and receive differential signals; connecting the transmit and receive differential signals to the integrated circuit die using a lead frame comprising at least four leads; and connecting the leads to the pads using at least four bondwires, wherein a set of polarities of adjacent signals carried by the at least four leads is different than a set of polarities of adjacent signals carried by the bondwires and the pads.

In other features, a first lead carries a signal having a first polarity, a second lead is adjacent to the first lead and carries a signal having a second polarity, a third lead is adjacent to the second lead and carries a signal having the second polarity and a fourth lead is adjacent to the third lead and carries a signal having the first polarity. A first pad carries a signal having the first polarity, a second pad is adjacent to the first pad and carries a signal having a second polarity, a third pad is adjacent to the second pad and carries a signal having the first polarity and a fourth pad is adjacent to the third pad and carries a signal having the second polarity. The first and second polarities are opposite polarities. The leads of the lead frame carry high speed differential signals. The high speed signals have a frequency greater than or equal to 1 Gigabit per second (Gb/s).

In other features, the method comprises spacing the four leads at least a first distance from the integrated circuit die; and spacing fifth and sixth leads a second distance from the integrated circuit die, wherein the first distance is greater than the second distance. The method comprises providing fifth and sixth leads; providing fifth and sixth pads on the integrated circuit die; connecting the fifth and sixth leads to the fifth and sixth pads using fifth and sixth bondwires. The first, second, third and fourth bondwires have a first length and the fifth and sixth bondwires have a second length and wherein the second length is shorter than the first length. The fifth and sixth leads carry signals having a first speed. The four leads carry signals having a second speed that is higher than the first speed. The method comprises providing a fifth pad on the integrated circuit die. The first bondwire comprises first and second bondwires that are stacked and connected between the first lead and the first pad and the fifth pad, respectively, of the integrated circuit die. The method comprises using first and second stacked bondwires for each of the first, second, third and fourth bondwires.

An integrated circuit package comprises integrated circuit die means for providing a function comprising at least four connecting means for providing a connection surface that at least one of transmit and receive differential signals, a lead frame comprising at least four conducting means for conducting, and at least four wire means for connecting the leads to the pads, wherein a set of polarities of adjacent signals carried by the at least four conducting means is different than a set of polarities of adjacent signals carried by the wire means and the connecting means.

In other features, a first of the four conducting means carries a signal having a first polarity, a second of the four conducting means is adjacent to the first of the four conducting means and carries a signal having a second polarity, a third of the four conducting means is adjacent to the second of the four conducting means and carries a signal having the second polarity and a fourth of the four conducting means is adjacent to the third of the four conducting means and carries a signal having the first polarity. A first of the four connecting means carries a signal having the first polarity, a second of the four connecting means is adjacent to the first of the four connecting means and carries a signal having a second polarity, a third of the four connecting means is adjacent to the second of the four connecting means and carries a signal having the first polarity and a fourth of the four connecting means is adjacent to the third of the four connecting means and carries a signal having the second polarity, and wherein the first and second polarities are opposite polarities. The conducting means of the lead frame carries high speed differential signals. The high speed differential signals have a frequency greater than or equal to 1 Gigabit per second (Gb/s). The four conducting means are spaced at least a first distance from the integrated circuit die and the lead frame further comprises fifth and sixth conducting means for conducting that are spaced a second distance from the integrated circuit die means, wherein the first distance is greater than the second distance.

In other features, fifth and sixth wire means connects fifth and sixth conducting means to fifth and sixth connecting means. The first, second, third and fourth wire means have a first length and the fifth and sixth wire means have a second length. The second length is shorter than the first length. The fifth and sixth conducting means carry signals having a first speed. The four conducting means carry signals having a second speed that is higher than the first speed.

In other features, the integrated circuit package includes a high speed serializer/deserializer means for serializing and deserializing signals.

In other features, a network interface comprising the integrated circuit package. The network interface is Ethernet compliant at speeds greater than 1 Gigabit per second.

In other features, fifth connecting means provides a connection surface on the integrated circuit die. The first wire means comprises first and second stacked wire means that are stacked and connected between the first conducting means and the first connecting means and the fifth connecting means, respectively, of the integrated circuit die means. The first, second, third and fourth wire means each comprise first and second stacked wire means.

In still other features, the integrated circuit package is implemented in a hard disk drive, a digital versatile disc, a set top box, a vehicle control system, a cellular phone and/or a media player.

An integrated circuit package comprises an integrated circuit die comprising N adjacent pads, where N is an integer greater than three. A lead frame comprises a first pair of leads including a first and second lead and a second pairs of leads including third and fourth leads. The first, second, third and fourth leads include first ends that are spaced from the integrated circuit die and second ends that are adjacent to the integrated circuit die. The first and second pairs of leads carry differential signals. The third lead of the second pair of leads has a first polarity and the fourth lead of the second pair of leads has a second polarity. The third lead is located on one side of the fourth lead at the first end and is located on an opposite side of the fourth lead at the second end. N connections connect the second ends of the first and second pairs of leads to the N adjacent pads.

In other features, the N connections comprise N bondwires. The third lead crosses the fourth lead. The fourth lead is segmented and comprises first and second segments and a bondwire connecting the first and second segments over the third lead. The second end of the third lead is located between the second ends of the second lead and the fourth lead. The second end of the fourth lead is located between the second ends of the third lead and the second lead. The third lead comprises a first section, a second section and a middle section that connects the first and second sections. The first section is co-linear with the first segment of the fourth lead and the second section is co-linear with the second segment. The first and second pairs of leads of the lead frame carry high speed differential signals. The high speed differential signals have a frequency greater than or equal to 1 Gigabit per second (Gb/s).

In other features, the second ends of the first and second pairs of leads are spaced at least a first distance from the integrated circuit die and the lead frame further comprises fifth and sixth leads that are spaced a second distance from the integrated circuit die, wherein the first distance is greater than the second distance. Fifth and sixth bondwires connect fifth and sixth leads to fifth and sixth pads. The N bondwires have a first length and the fifth and sixth bondwires have a second length that is shorter than the first length. The fifth and sixth leads carry signals having a first speed. The first and second pairs of leads carry signals having a second speed that is higher than the first speed.

In other features, a serializer/deserializer (SERDES) module communicates with the N pads. A network interface comprises the integrated circuit package. The network interface is Ethernet compliant and operates at speeds greater than 1 Gigabit per second. At least one of the N bondwires comprises first and second bondwires that are stacked and connected between one of the first and second pairs of leads and one of the N pads of the integrated circuit die.

A method of providing an integrated circuit package comprises: providing N adjacent pads on an integrated circuit die, where N is an integer greater than three; providing a lead frame comprising a first pair of leads including a first and second lead and a second pair of leads including third and fourth leads, wherein the first, second, third and fourth leads include first ends that are spaced from the integrated circuit die and second ends that are adjacent to the integrated circuit die; using the first and second pairs of leads to carry differential signals wherein the third lead of the second pair of leads has a first polarity and the fourth lead of the second pair of leads has a second polarity; locating the third lead on one side of the fourth lead at the first end and on an opposite side of the fourth lead at the second end; and connecting the second ends of the first and second pairs of leads to the N adjacent pads.

In other features, the method comprises connecting the second ends of the first and second pairs of leads using N bondwires. The third lead crosses the fourth lead. The fourth lead is segmented and comprises first and second segments and a bondwire connecting the first and second segments over the third lead. The second end of the third lead is located between the second ends of the second lead and the fourth lead.

In other features, the second end of the fourth lead is located between the second ends of the third lead and the second lead. The third lead comprises a first section, a second section and a middle section that connects the first and second sections. The first section is co-linear with the first segment of the fourth lead and the second section is co-linear with the second segment. The first and second pairs of leads of the lead frame carry high speed differential signals. The high speed differential signals have a frequency greater than or equal to 1 Gigabit per second (Gb/s).

In other features, the method comprises spacing the second ends of the first and second pairs of leads at least a first distance from the integrated circuit die and the lead frame further comprises fifth and sixth leads that are spaced a second distance from the integrated circuit die, wherein the first distance is greater than the second distance.

In other features, the method comprises providing fifth and sixth leads and providing fifth and sixth pads on the integrated circuit die; and using fifth and sixth bondwires to connect the fifth and sixth leads to the fifth and sixth pads, wherein the N bondwires have a first length and the fifth and sixth bondwires have a second length that is shorter than the first length.

In other features, the method comprises using the fifth and sixth leads to carry signals having a first speed; and using the first and second pairs of leads to carry signals having a second speed that is higher than the first speed. The integrated circuit die includes a serializer/deserializer (SERDES) module that communicates with the N pads. The integrated circuit die implements a network interface that is Ethernet compliant and operates at speeds greater than 1 Gigabit per second.

In other features, at least one of the N bondwires comprises first and second bondwires that are stacked and connected between one of the first and second pairs of leads and one of the N pads of the integrated circuit die.

An integrated circuit package comprises an integrated circuit die comprising N adjacent pads, where N is an integer greater than three. A substrate comprises a first pair of traces including first and second traces and a second pair of traces including third and fourth traces. The first, second, third and fourth traces include first ends that are spaced from the integrated circuit die and second ends that are adjacent to the integrated circuit die. The first and second pairs of traces carry differential signals. The third trace of the second pair of traces has a first polarity and the fourth trace of the second pair of traces has a second polarity. The third trace is located on one side of the fourth trace at the first end and is located on an opposite side of the fourth trace at the second end. N connections independently connect the second ends to N pads.

In other features, the N connections comprise N bondwires that connect the second ends to the N pads. The third trace crosses the fourth trace. The fourth trace is segmented. The fourth trace comprises first and second segments, a first via that passes through the substrate and communicates with the first segment, a second via that passes through the substrate and communicates with the second segment, and a trace on an opposite side of the substrate that communicates with the first and second vias. The second end of the third trace is located between the second ends of the fourth trace and the second trace.

In other features, the second end of the fourth trace is located between the second ends of the third trace and the second trace. The third trace comprises a first section, a second section and a middle crossover section that connects the first and second sections. The first section is co-linear with the first segment and the second section is co-linear with the second segment. The first and second pairs of traces of the substrate carry high speed differential signals. The high speed differential signals have a frequency greater than or equal to 1 Gigabit per second (Gb/s). The second ends of the first and second pairs of traces are spaced at least a first distance from the integrated circuit die and the substrate further comprises fifth and sixth traces that are spaced a second distance from the integrated circuit die, wherein the first distance is greater than the second distance. Fifth and sixth bondwires connect fifth and sixth traces to fifth and sixth pads. The N bondwires have a first length and the fifth and sixth bondwires have a second length that is shorter than the first length.

In other features, the fifth and sixth traces carry signals having a first speed and wherein the first and second pairs of traces carry signals having a second speed that is higher than the first speed. A serializer/deserializer (SERDES) module communicates with the N pads. A network interface comprising the integrated circuit package. The network interface is Ethernet compliant and operates at speeds greater than 1 Gigabit per second. At least one of the N bondwires comprises first and second bondwires that are stacked and connected between at least one of the first, second, third and fourth traces and at least one of the N pads of the integrated circuit die.

In other features, the substrate includes a first conductive plane. The fourth trace comprises first and second trace segments, a first via that passes through the substrate to the first conductive plane and communicates with the first segment, a second via that passes through the substrate to the first conductive plane and communicates with the second segment, and jumper that is coplanar with and isolated from the first conductive plane and that communicates with the first and second vias. The first conductive plane includes one of a ground plane, a signal plane and a power plane.

A method of providing an integrated circuit package comprises: providing N adjacent pads on an integrated circuit die, where N is an integer greater than three; providing a substrate comprising a first pair of traces including first and second traces and a second pair of traces including third and fourth traces. The first, second, third and fourth traces include first ends that are spaced from the integrated circuit die and second ends that are adjacent to the integrated circuit die. The first and second pairs of traces carry differential signals. The third trace of the second pair of traces has a first polarity and the fourth trace of the second pair of traces has a second polarity. The third trace is located on one side of the fourth trace at the first end and is located on an opposite side of the fourth trace at the second end. The method comprises independently connecting the second ends to N pads.

In other features, the method comprises using N bondwires to connect the second ends to the N pads. The third trace crosses the fourth trace. The fourth trace is segmented. The fourth trace comprises first and second segments, a first via that passes through the substrate and communicates with the first segment, a second via that passes through the substrate and communicates with the second segment, and a trace on an opposite side of the substrate that communicates with the first and second vias.

In other features, the second end of the third trace is located between the second ends of the fourth trace and the second trace. The second end of the fourth trace is located between the second ends of the third trace and the second trace. The third trace comprises a first section, a second section and a middle crossover section that connects the first and second sections. The first section is co-linear with the first segment and the second section is co-linear with the second segment. The first and second pairs of traces of the substrate carry high speed differential signals. The high speed differential signals have a frequency greater than or equal to 1 Gigabit per second (Gb/s).

In other features, the method comprises spacing the second ends of the first and second pairs of traces at least a first distance from the integrated circuit die; and providing fifth and sixth traces that are spaced a second distance from the integrated circuit die, wherein the first distance is greater than the second distance.

In other features, the method comprises providing fifth and sixth traces; providing fifth and sixth pads on the integrated circuit die; using fifth and sixth bondwires connecting the fifth and sixth traces to the fifth and sixth pads, wherein the N bondwires have a first length and the fifth and sixth bondwires have a second length that is shorter than the first length.

In other features, the method comprises using the fifth and sixth traces to carry signals having a first speed; and using the first and second pairs of traces to carry signals having a second speed that is higher than the first speed. The method comprises connecting a serializer/deserializer (SERDES) module to the N pads.

In other features, the method comprises implementing a network interface on the integrated circuit die that is Ethernet compliant and operates at speeds greater than 1 Gigabit per second. At least one of the N bondwires comprises first and second bondwires that are stacked and connected between at least one of the first, second, third and fourth traces and at least one of the N pads of the integrated circuit die. The substrate includes a first conductive plane and wherein the fourth trace comprises first and second trace segments, a first via that passes through the substrate to the first conductive plane and communicates with the first segment, a second via that passes through the substrate to the first conductive plane and communicates with the second segment, and jumper that is coplanar with and isolated from the first conductive plane and that communicates with the first and second vias. The first conductive plane includes one of a ground plane, a signal plane and a power plane.

An integrated circuit package comprises an integrated circuit die comprising N pads, where N is an integer greater than one. A lead frame comprises N adjacent leads. N connections individually connect the N leads to the N pads, respectively. A first material comprising an insulating layer and a conductive layer, wherein the insulating layer is adhesively arranged on the N leads of the lead frame.

In other features, the N connections comprise N bondwires. The first material comprises a plurality of spaced perforations. A packaging material contacts the integrated circuit die, the first material, the lead frame and the N bondwires. The N leads comprise first, second, third and fourth leads. The first and second leads and the third and fourth leads are spaced at a first distance and the second and third leads are spaced at a second distance that is different than the first distance. The first and second leads and the third and fourth leads of the lead frame carry high speed differential signals. The high speed differential signals have a frequency greater than or equal to 1 Gigabit per second (Gb/s). The lead frame further comprises a fifth lead that is spaced a third distance from the fourth lead. The third distance is different than the first and second distances. A sixth lead is spaced a fourth distance from the fifth lead. The fourth distance is different than the first distance. The fifth and sixth leads carry control signals.

In other features, a serializer/deserializer (SERDES) module communicates with the first, second, third and fourth pads. The N pads include first, second, third and fourth pads and wherein the first and second pads of the integrated circuit die are associated with differential transmit signals of the SERDES module and the third and fourth pads of the integrated circuit die are associated with differential receive signals of the SERDES module. A network interface comprises the integrated circuit package. The network interface is Ethernet compliant and operates at speeds greater than 1 Gigabit per second. The first distance is less than the second distance.

In other features, a fifth lead is located between the second and third leads and communicates with a reference potential. The first material comprises conductive tape.

In other features, the N adjacent leads comprise a first pair of leads comprising first and second leads and a second pairs of leads comprising third and fourth leads, wherein the first, second, third and fourth leads include first ends that are spaced from the integrated circuit die and second ends that are adjacent to the integrated circuit die. The first and second pairs of leads carry differential signals. The third lead of the second pair of leads has a first polarity and the fourth lead of the second pair of leads has a second polarity. The third lead is located on one side of the fourth lead at the first end and is located on an opposite side of the fourth lead at the second end.

A method for providing an integrated circuit package comprises: providing an integrated circuit die comprising N pads, where N is an integer greater than one; providing a lead frame comprising N adjacent leads; individually connecting the N leads to the N pads, respectively; and adhesively arranging a first material comprising a conductive layer and an insulating layer on the N leads of the lead frame.

In other features, the individually connecting comprises using N bondwires. The first material comprises a plurality of spaced perforations. The method comprises packaging the integrated circuit die, the first material, the lead frame and the N bondwires in a packaging material. The N leads comprise first, second, third and fourth leads.

In other features, the method comprises spacing the first and second leads and the third and fourth leads at a first distance; and spacing the second and third leads at a second distance that is different than the first distance. The method comprises carrying high speed differential signals using the first and second leads and the third and fourth leads of the lead frame. The high speed differential signals have a frequency greater than or equal to 1 Gigabit per second (Gb/s). The lead frame further comprises a fifth lead and further comprising spacing the fifth lead a third distance from the fourth lead. The third distance is different than the first and second distances.

In other features, the method comprises providing a sixth lead; and spacing the sixth lead a fourth distance from the fifth lead, wherein the fourth distance is different than the first distance. The method comprises carrying control signals using the fifth and sixth leads. The method comprises coupling a serializer/deserializer (SERDES) module to the first, second, third and fourth pads.

In other features, the N pads include first, second, third and fourth pads and the method comprises associating the first and second pads of the integrated circuit die with differential transmit signals of the SERDES module; and associating the third and fourth pads of the integrated circuit die with differential receive signals of the SERDES module. The method comprises implementing a network interface using the integrated circuit package. The network interface is Ethernet compliant and further comprising operating the network interface at speeds greater than 1 Gigabit per second.

In other features, the first distance is less than the second distance. The method comprises locating a fifth lead between the second and third leads and connecting said fifth lead with a reference potential. The first material comprises conductive tape.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 5 is a partial plan view of differential signal pairs connected by leads of a lead frame and bondwires to pads of the IC according to another implementation of the present invention;

FIG. 13A is a side view of packaging including a ball grid array substrate;

FIG. 13B is a side view of packaging including flip chip and a ball grid array substrate;

FIG. 13C is a cross sectional view of one exemplary BGA packaging;

FIG. 14A is a plan view illustrating a BGA jumper for high speed traces that are connected to the integrated circuit die;

FIG. 14B is a simplified cross sectional view illustrating a BGA jumper;

FIG. 15A is a simplified cross sectional view illustrating an alternate BGA jumper that employs a ground plane thereof;

FIG. 15B is a simplified cross sectional view illustrating an alternate BGA jumper that employs a power plane thereof; and FIG. 15C is a plan view illustrating a power plane and the BGA jumper of FIG. 15B.

DETAILED DESCRIPTION OF THE PREFERRED EMBODIMENTS

Figure 1:
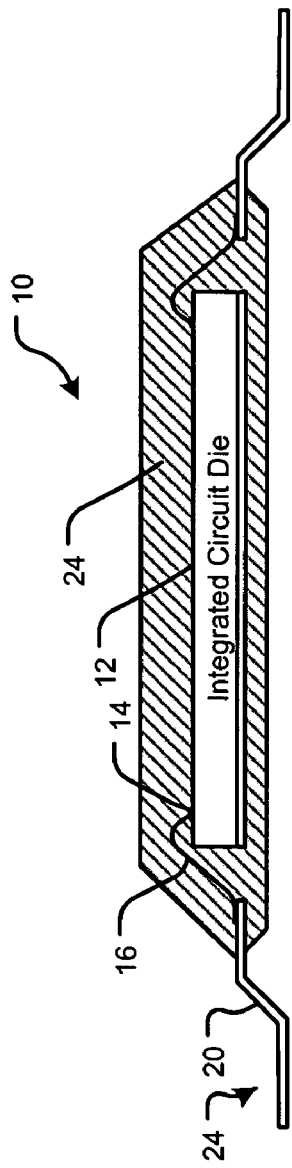
FIG. 1 is a side cross sectional view of a first exemplary package, an IC, bondwires, and leads of a lead frame according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 4:
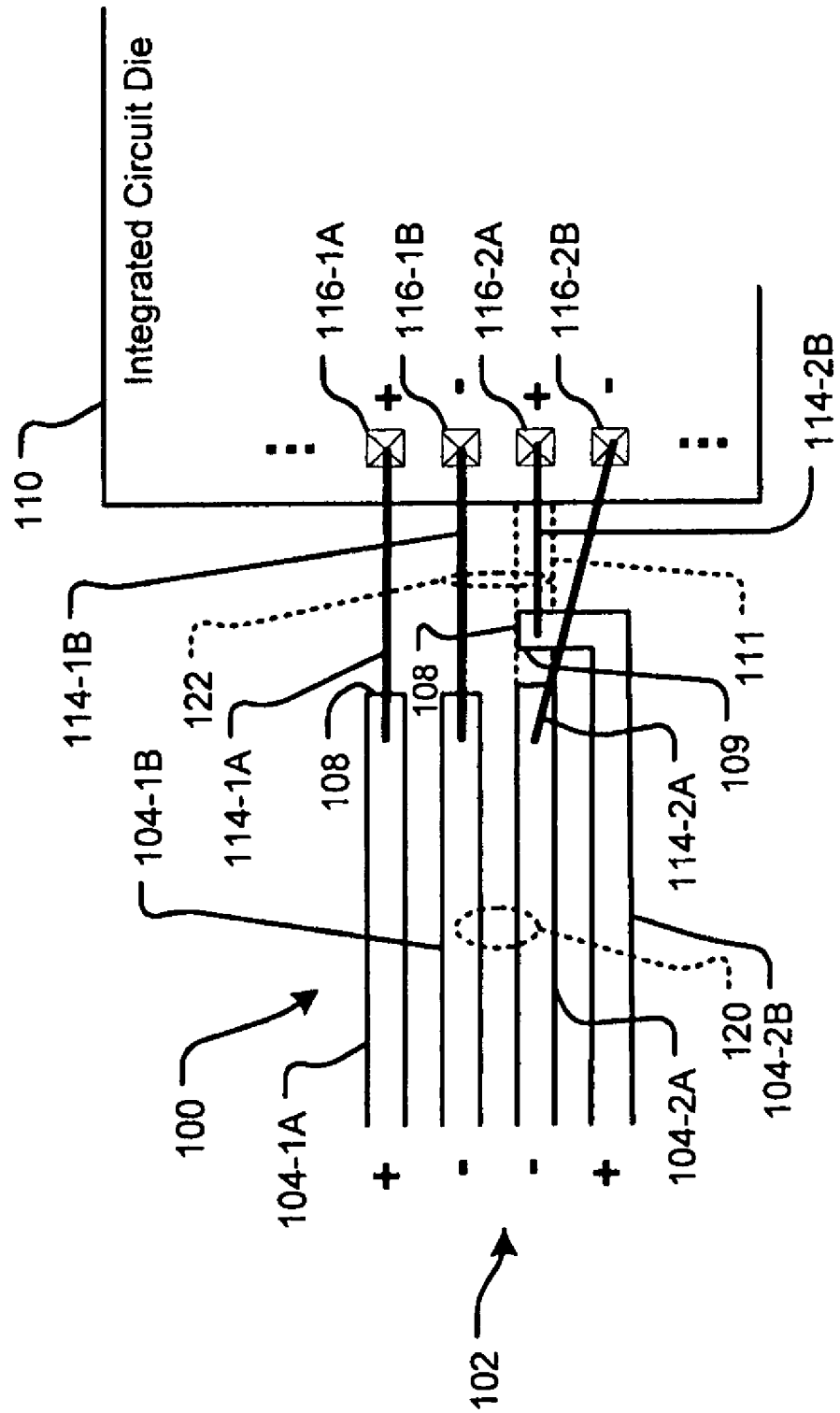
FIG. 4 is a partial plan view of differential signal pairs connected by leads of a lead frame and bondwires to pads of the IC according to one implementation of the present invention.

The present invention reduces pair coupling of differential lines operating at high speeds. Referring now to FIG. 4, differential signal pairs are connected by leads of a lead frame and bondwires to pads of the IC according to one implementation of the present invention. A lead frame 100 comprises one or more sets 102 of leads 104 including a first pair of leads 104-1A and 104-1B and a second pair of leads 104-2A and 104-2B (collectively leads 104). The lead 104-1A is located adjacent to the lead 104-1B, the lead 104-1B is located adjacent to the lead 104-2A, and the lead 104-2A is located adjacent to the lead 104-2B.

The lead 104-1A carries a signal having a first polarity, the lead 104-1B carries a signal having a second polarity, the lead 104-2A carries a signal having a second polarity, and the lead 104-2B carries a signal having a first polarity, respectively. Portions 108 of the leads 104 near an IC 110 are generally parallel to one another. An end 109 of at least one of the leads 104, such as lead 104-2B, extends longer than others of the leads 104. The at least one of the leads 104-2A also extends in a direction towards an adjacent lead, such as lead 104-2A. In some implementations, the at least one of the leads 104-2B extends into a parallel path 111 that is defined by the adjacent lead 104-2A as shown in FIG. 4. In some implementations, at least one lead 104-2B has a generally "L" shaped configuration.

Bondwires 114-1A, 114-1B, 114-2A and 114-2B connect the leads 104-1A, 104-1B, 104-2A and 104-2B to pads 116-1A, 116-1B, 116-2B and 116-2A, respectively. Therefore, pads 116-1A, 116-1B, 116-2A and 116-2B are now connected to the first polarity, the second polarity, the first polarity and the second polarity, respectively. In other words, the orientation of the bondwires 114-2A and 114-2B is flipped relative to the orientation of the leads 104-2A and 104-2B. As a result of the packaging arrangement shown in FIG. 4, coupling between pairs for example at 120 and 122 is reduced due to partial cancellation. The lead frame may include one or more sets of leads similar to those shown as represented by dotted lines in FIG. 4.

Referring now to FIG. 5, while coupling is reduced, coupling cancellation is not complete since the leads of the lead frame are typically longer than the bondwires. To improve cancellation, the packaging according to some implementations of the present invention employs high speed leads that are shorter than leads carrying lower speed signals such as but not limited to control and/or status signals. The lead frame 150 may include one or more sets of high speed leads 102-1 and 102-2 and one or more sets of low speed leads 152. The high speed leads 102-1 and 102-2 have ends 156-1 and 156-2 that are spaced at least a distance H from the IC 110 while the low speed leads are spaced a distance L from the IC 110, where H>L. The low speed leads 152 include leads 154-A and 154-B, which are connected to the pads 156-A and 156-B. The low speed leads 152 extend longer than the high speed leads 102-1 and 102-2. The shorter high speed leads 102-1 and 102-2 tend to improve coupling cancellation. The low speed leads 152 are longer and require shorter bondwires, which tends to reduce the cost of the bondwires.

Figure 6A:
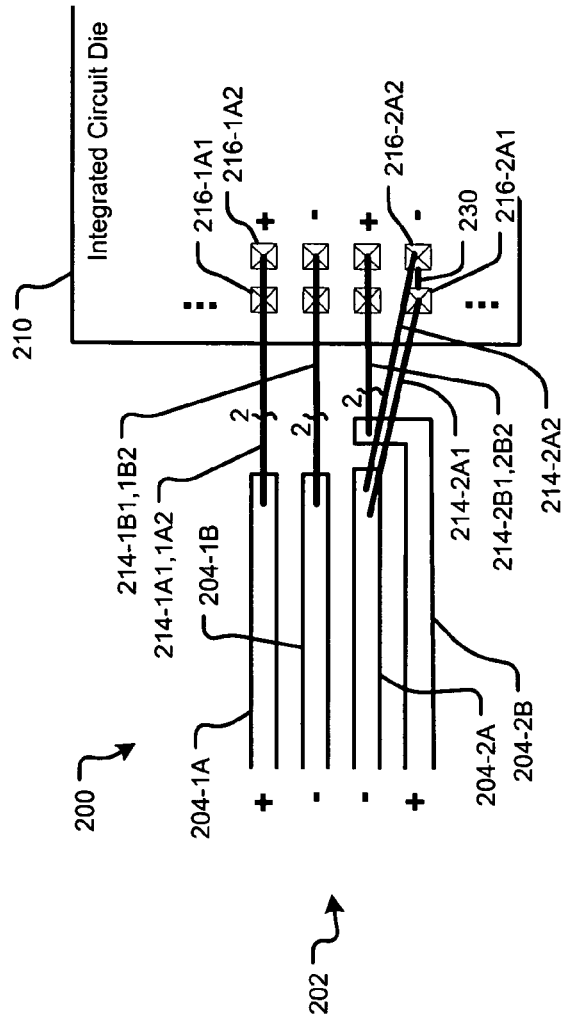
FIG. 6A is a partial plan view of differential signal pairs connected by leads of a lead frame and stacked bondwires to pads of the IC according to another implementation of the present invention.
Figure 6B:
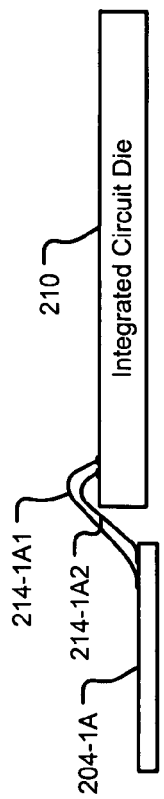
FIG. 6B is a partial side view of differential signal pairs connected by leads of a lead frame and stacked bondwires to pads of the IC of FIG. 6A.

Referring now to FIGS. 6A and 6B, differential signal pairs are connected by leads of a lead frame and two or more stacked bondwires to pads of the IC. A lead frame 200 comprises a set of leads 202 including a first pair of leads 204-1A and 204-2B and a second pair of leads 204-2A and 204-2B (collectively the leads 204). The lead 204-1A is located adjacent to the lead 204-1B, the lead 204-1B is located adjacent to the lead 204-2A, and the lead 204-2A is located adjacent to the lead 204-2B.

The lead 204-1A carries a signal having a first polarity, the lead 204-1B carries a signal having a second polarity, the lead 204-2A carries a signal having a second polarity, and the lead 204-2B carries a signal having a first polarity, respectively. End portions of the leads 204 near an IC 210 are generally parallel to one another. At least one of the leads 204, such as lead 204-2B, extends longer than others of the leads 204. The at least one of the leads 204 also extends in a direction towards an adjacent lead, such as lead 202-A. In some implementations, the at least one of the leads 204 extends into a parallel path that is defined by the adjacent lead 204 as shown in FIG. 6A. Additional sets of high speed leads and/or low speed leads can be used Bondwires 214-1A1 and 214-1A2, 214-1B1, 214-1B2, 214-2A1, 214-2A2 and 214-2B1 and 214-2B2 (collectively bondwires 214) connect leads 204-1A, 204-1B, 204-2A and 204-2B to pads 216-1A1 and 216-1A2, 216-1B1 and 216-1B2, 216-2A1 and 216-2A2 and 216-2B1 and 216-2B2, respectively. Therefore, pads 216-1A1 and 216-1A2, 216-1B1 and 216-1B2, 216-2A1 and 216-2A2, and 216-2B1 and 216-2B2 (collectively pads 216) are now connected to the first polarity, the second polarity, the first polarity and the second polarity, respectively. Ends of the bondwires 214 may be attached to the leads 204 in a spaced and/or overlapping relationship. Pads 216 may be connected together by external and/or internal vias and/or traces 230.

Benefits of the stacked bondwires 214 include increased bondwire capacitance. Bondwire coupling between stacked bondwires 214 is increased. Bondwire capacitance per unit length is closer to lead frame capacitance per unit length. The stacked bondwires 214 also have lower inductance per bondwire unit length. There is also a net lower transmission line impedance of the pair of signal pins between positive and negative pins. There is also improved coupling cancellation due to improved matched characteristics of stacked bondwires to the lead frame.

Figure 7:
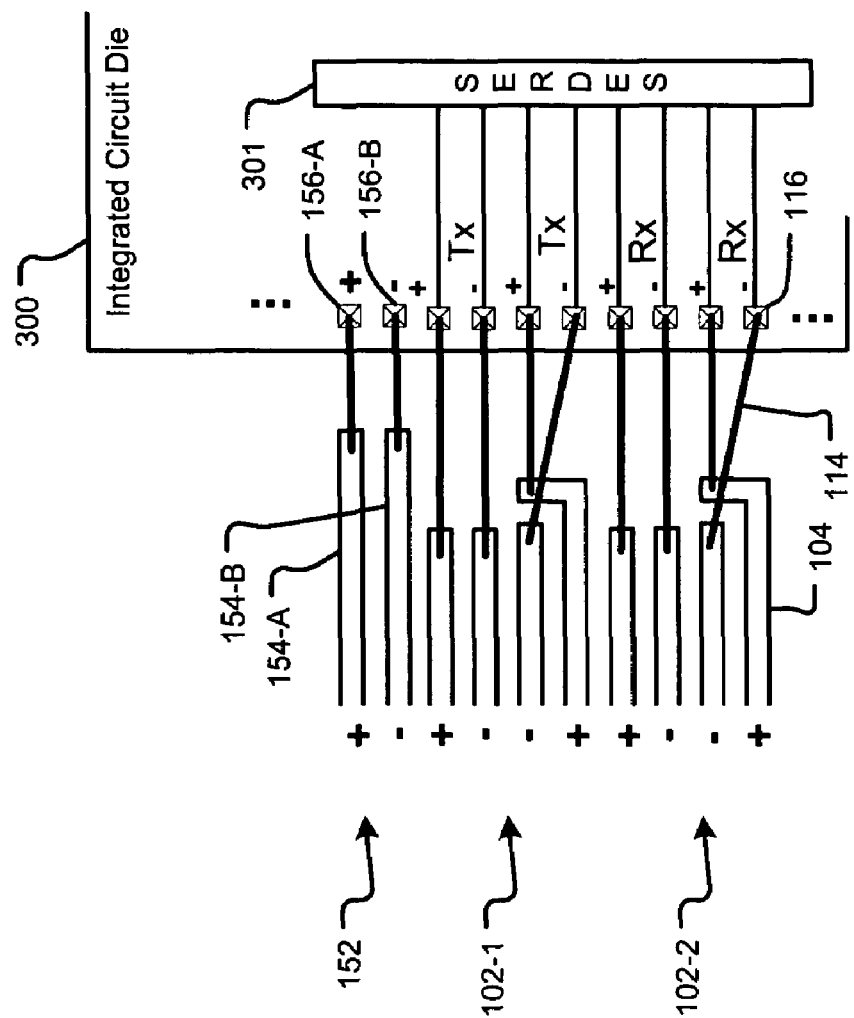
FIG. 7 illustrates packaging for an IC including a serializer/deserializer module that receives signals on differential transmit and receive pairs according to the present invention.

Referring now to FIG. 7, an integrated circuit die 300 includes a serializer/deserializer (SERDES) module 301 that receives signals on differential transmit and receive pairs according to the present invention. In some implementations, high speed differential pairs of the SERDES module 301 operate at speeds greater than or equal to 1 Gb/s.

Figure 8:
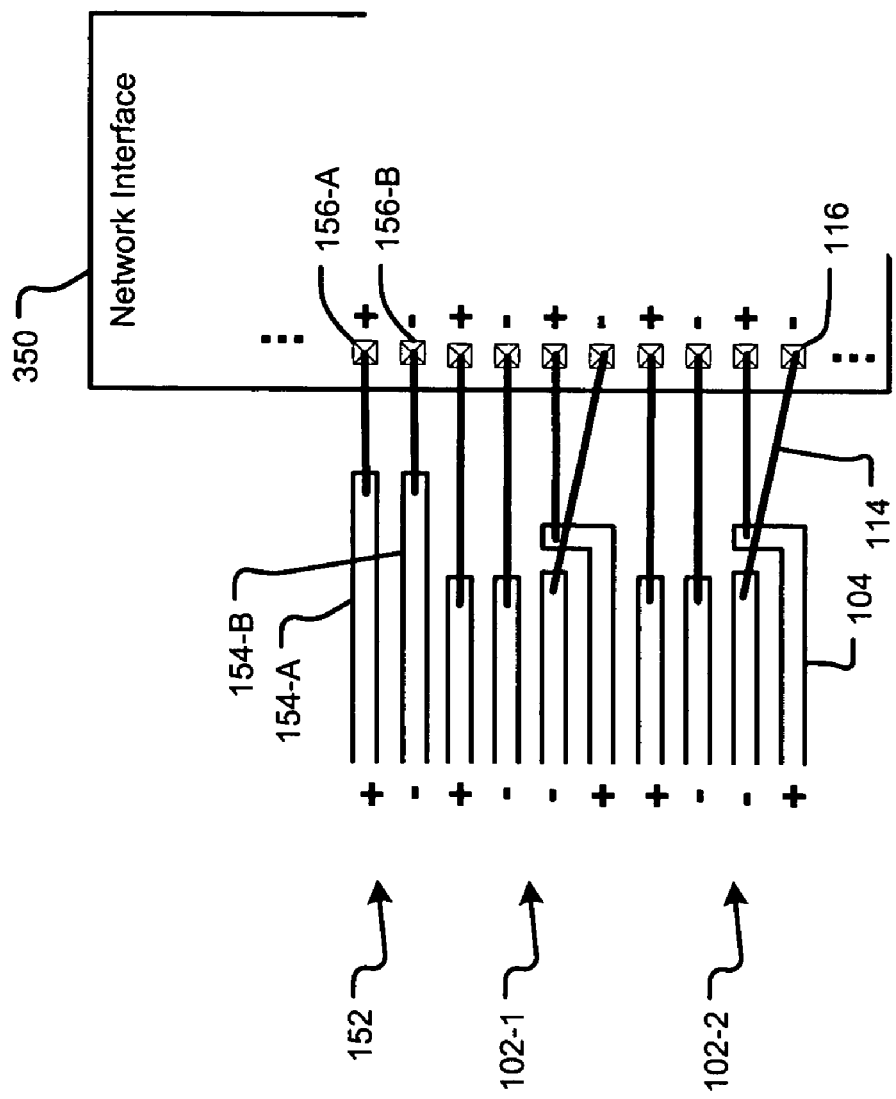
FIG. 8 illustrates a package for a network interface IC that employs the high speed packaging according to the present invention.

Referring now to FIG. 8, a network interface IC 350 includes differential pairs that employ the high speed packaging according to the present invention. In some implementations, high speed differential pairs of the network interface operate at speeds greater than or equal to 1 Gb/s. In some implementations, high speed differential pairs of the network interface operate at speeds greater than or equal to 10 Gb/s. In some implementations, the network interface comprises a physical layer device (PHY). In other implementations, the network interface comprises a medium access controller (MAC). In still other implementations, the network interface is compliant with 1 Gb/s and 10 Gb/s Ethernet protocols.

Figure 9B:
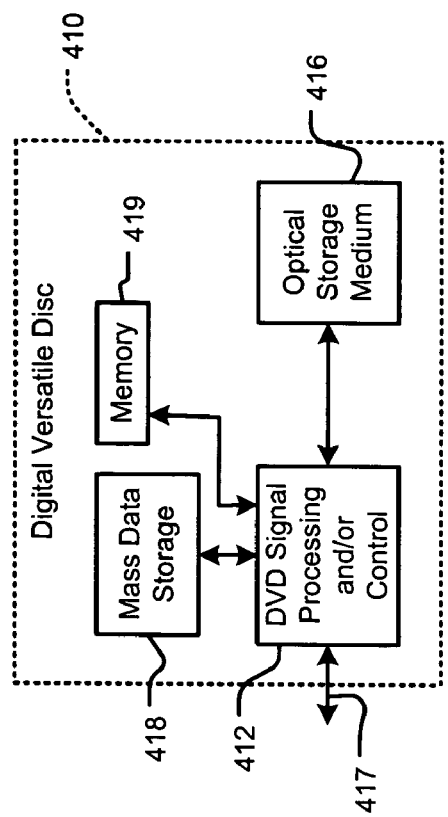
FIG. 9B illustrates the present invention arranged in a digital versatile disc.
Figure 9A:
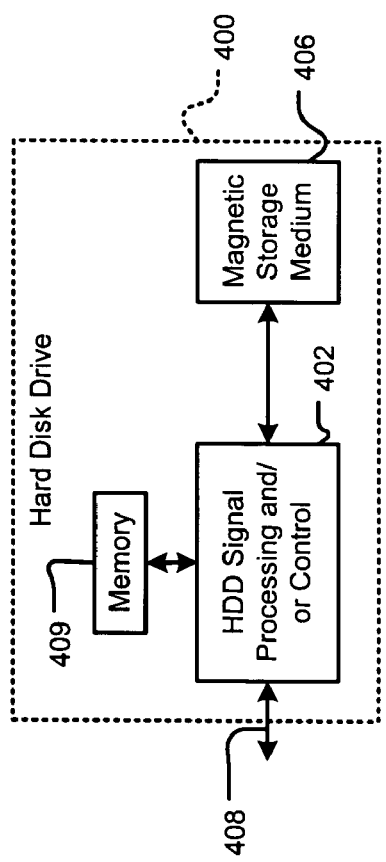
FIG. 9A illustrates the present invention arranged in a hard disk drive.

Referring now to FIGS. 9A-9G, various exemplary implementations of the present invention are shown. Referring now to FIG. 9A, the present invention can be implemented in a hard disk drive 400. The present invention may implement either or both signal processing and/or control circuits, which are generally identified in FIG. 9A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 9B, the present invention can be implemented in a digital versatile disc (DVD) drive 410. The present invention may implement either or both signal processing and/or control circuits, which are generally identified in FIG. 9B at 412, and/or mass data storage of the DVD drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 9A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 9D:
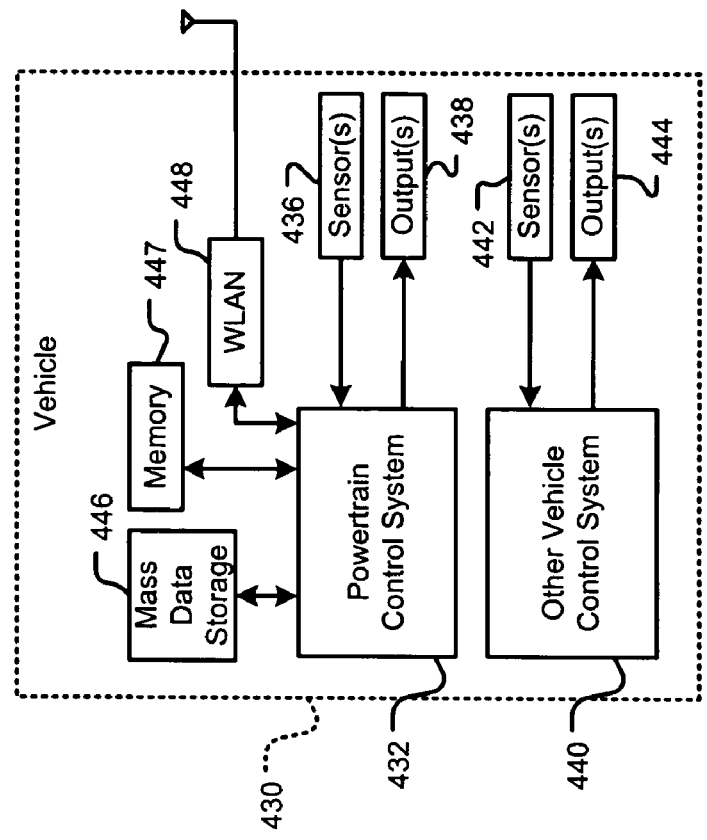
FIG. 9D illustrates the present invention arranged in a control system of a vehicle.
Figure 9C:
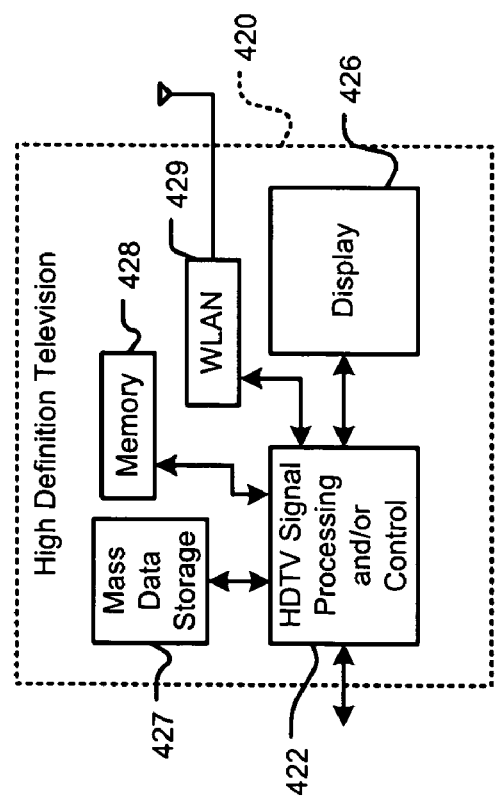
FIG. 9C illustrates the present invention arranged in a high definition television.

Referring now to FIG. 9C, the present invention can be implemented in a high definition television (HDTV) 420. The present invention may implement either or both signal processing and/or control circuits, which are generally identified in FIG. 9E at 422, a WLAN interface and/or mass data storage of the HDTV 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 9A and/or at least one DVD may have the configuration shown in FIG. 9B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 9D, the present invention implements a control system of a vehicle 430, a WLAN interface and/or mass data storage of the vehicle control system. In some implementations, the present invention implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 9E:
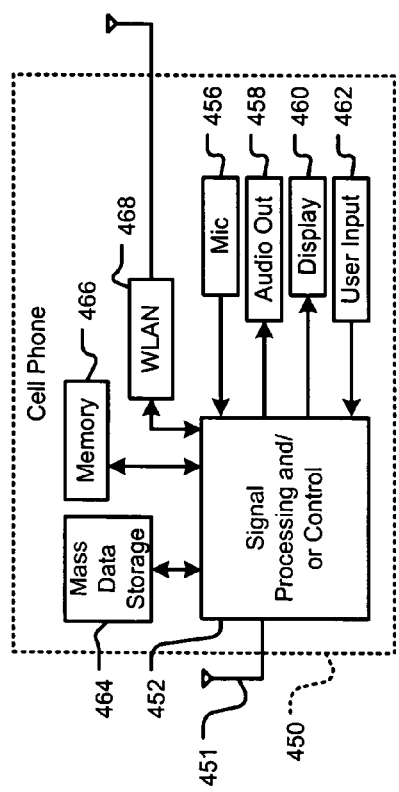
FIG. 9E illustrates the present invention arranged in a cellular phone.

Referring now to FIG. 9E, the present invention can be implemented in a cellular phone 450 that may include a cellular antenna 451. The present invention may implement either or both signal processing and/or control circuits, which are generally identified in FIG. 9E at 452, a WLAN interface and/or mass data storage of the cellular phone 450. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 9F:
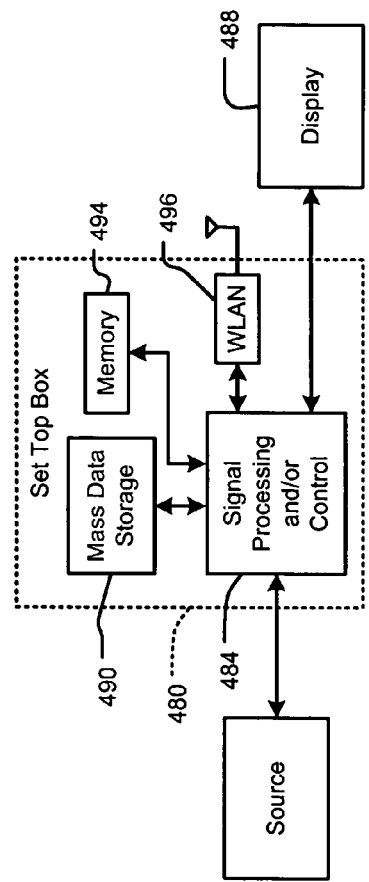
FIG. 9F illustrates the present invention arranged in a set top box.

Referring now to FIG. 9F, the present invention can be implemented in a set top box 480. The present invention may implement either or both signal processing and/or control circuits, which are generally identified in FIG. 9F at 484, a WLAN interface and/or mass data storage of the set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 9G:
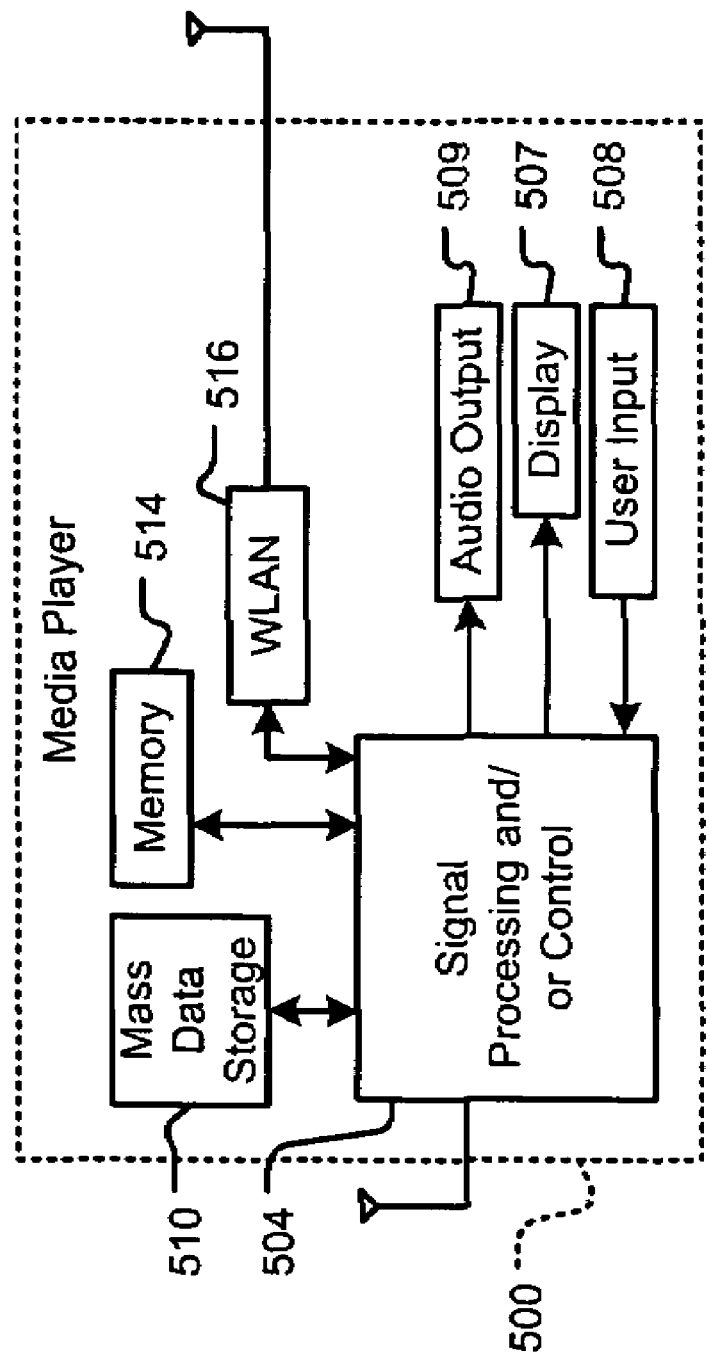
FIG. 9G illustrates the present invention arranged in a media player.

Referring now to FIG. 9G, the present invention can be implemented in a media player 500. The present invention may implement either or both signal processing and/or control circuits, which are generally identified in FIG. 9G at 504, a WLAN interface and/or mass data storage of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 9A and/or at least one DVD may have the configuration shown in FIG. 9B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Figure 10A:
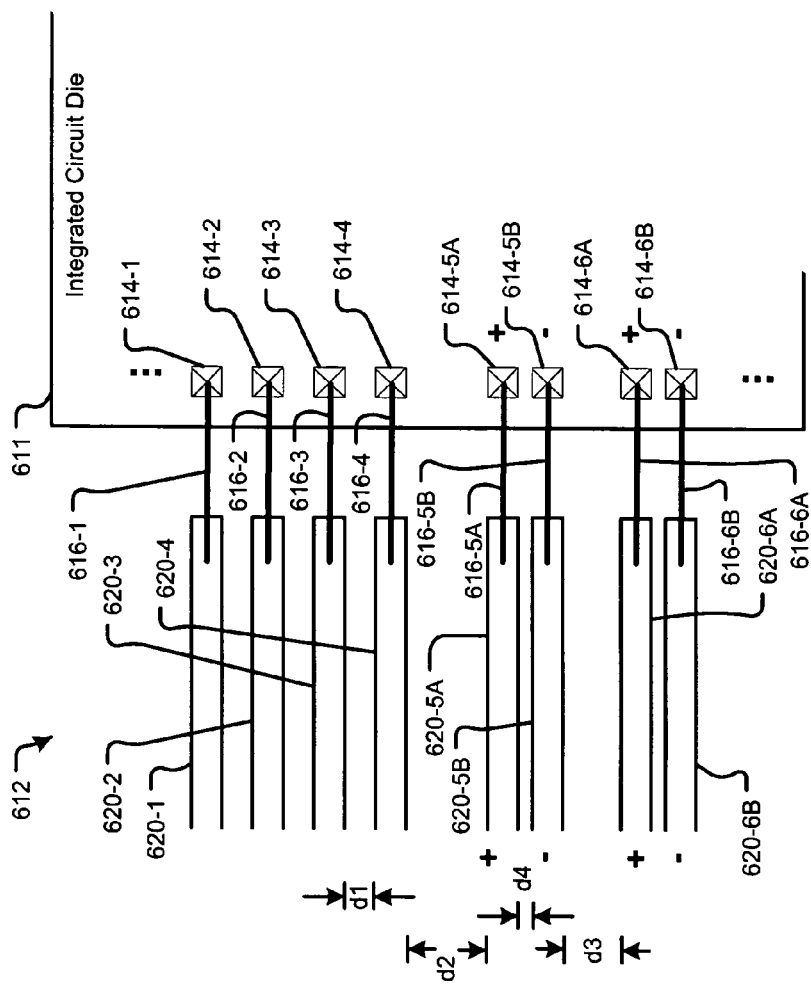
FIG. 10A illustrates a package including a lead frame having irregularly spaced leads.

Referring now to FIG. 10A, a package including an integrated circuit die 611 and a lead frame 612 having irregularly spaced leads is shown. The lead frame 612 comprises one or more sets of leads including leads 620-1, 620-2, 620-3 and 620-4, and a first pair of leads 620-5A and 620-5B and a second pair of leads 620-6A and 620-6B (collectively leads 620).

Bondwires 616-1, 616-2, 616-3, 616-4, 616-5A and 616-5B, and 616-6A and 616-6B connect the leads 620-1, 620-2, 620-3, 620-4, 620-5 and 620-5B, and 620-6A and 620-6B to pads 614-1, 614-2, 614-3, 614-4, 614-5 and 614-6 and 614-6A and 614-6B, respectively.

The leads 620-1, 620-2, 620-3 and 620-4 may be control leads that operate at a speed that is lower than the leads 620-5A and 620-5B and 620-6A and 620-6B that operate at high speed leads. The leads 620-5A and 620-5B and 620-6A and 620-6B may carry differential signals. Spacing between the low speed leads may be equal to $d_1$. Spacing between leads in a pair of high speed leads may be equal to $d_4$. Spacing between the low and high speed leads may be $d_2$. Spacing between the pairs of high speed leads may be $d_3$. The spacing $d_1$, $d_2$, $d_3$ and $d_4$ may be irregular to increase or decrease coupling. For example, the spacing $d_4$ may be less than the spacing $d_3$. The spacing $d_4$ may be less than the spacing $d_1$.

Figure 10B:
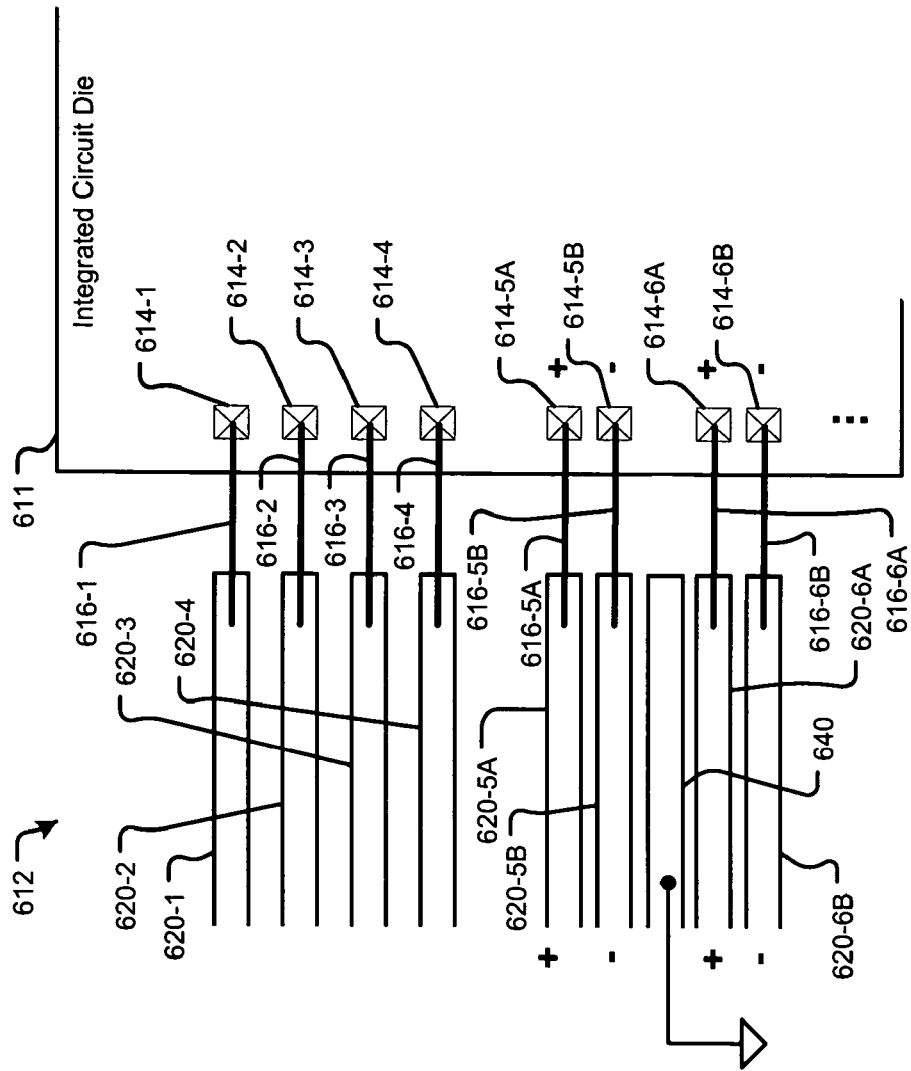
FIG. 10B illustrates a package including a lead frame having irregularly spaced leads and a ground lead between high speed leads.

Referring now to FIG. 10B, a package including a lead frame having irregularly spaced leads and a ground lead is shown. A lead 640 is located between pairs of high speed leads and may be connected to a reference potential such as ground to reduce coupling. The lead 640 may or may not be connected to the integrated circuit die. As can be appreciated, the lead frame in FIGS. 10A and 10B may incorporate crossovers as well as other features described above.

Figure 11B:
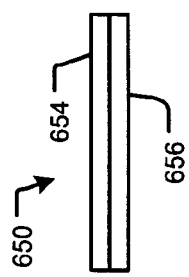
FIG. 11B is a cross sectional side view of the conductive tape of FIG. 11A.
Figure 11C:
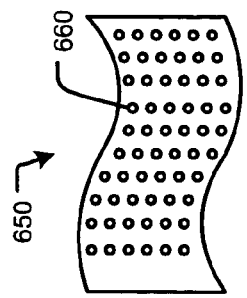
FIG. 11C is a partial plan view of the conductive tape of FIG. 11A showing perforations.
Figure 11A:
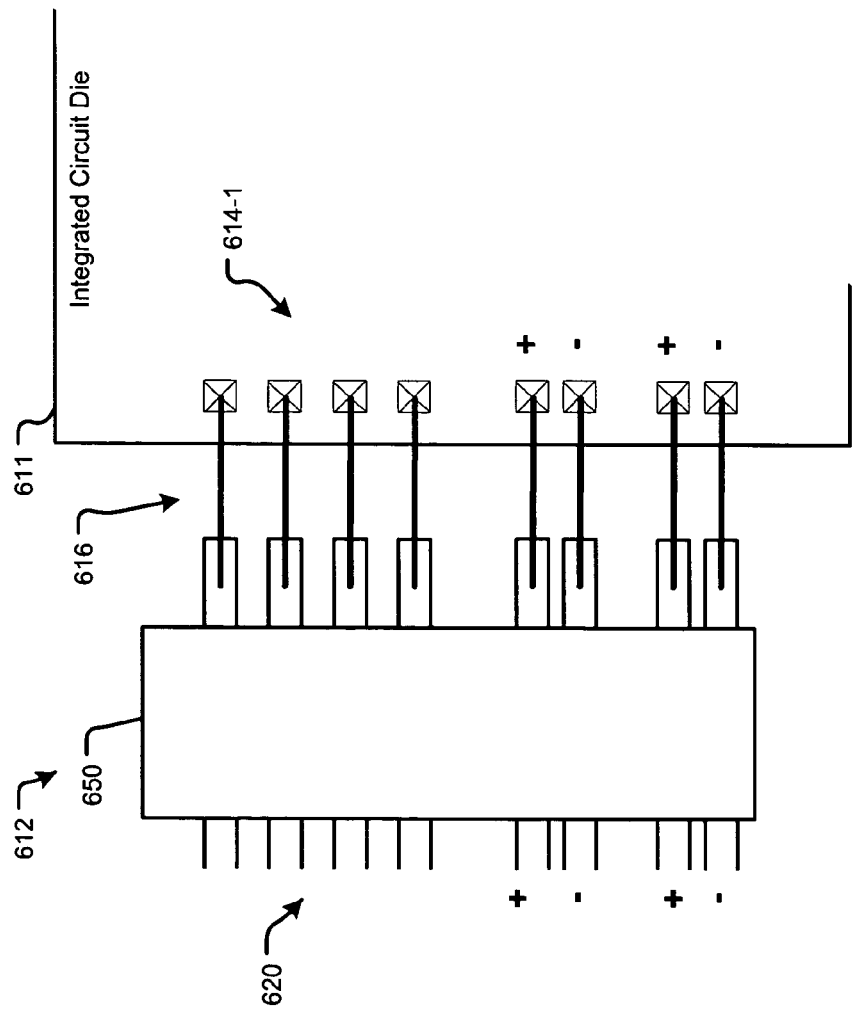
FIG. 11A illustrates a package including a lead frame having irregularly spaced leads and conductive tape with an insulating adhesive layer that is connected to the leads.

Referring now to FIGS. 11A-11C, a package for the integrated circuit die 611 includes the lead frame 612. Conductive tape 650 is applied to at least one side of the leads 620 of the lead frame 612. For example, the conductive tape may be connected to a top side of the leads, a bottom side of the leads, or both the top and bottom sides of the leads. The conductive tape may also be applied to some leads but not other leads. The conductive tape 650 includes with an inner insulating adhesive layer 654 and an outer conducting layer 656. The insulting layer 654 prevents shorting the leads. The insulating adhesive layer 654 is connected to the leads 620. In FIG. 11C, the conductive tape 650 may include spaced perforations to allow the packaging material to flow through the perforations 660 during manufacturing, which increases strength. The conductive layer 656 provides a ground plane that conducts magnetic flux, which reduces coupling.

Figure 12B:
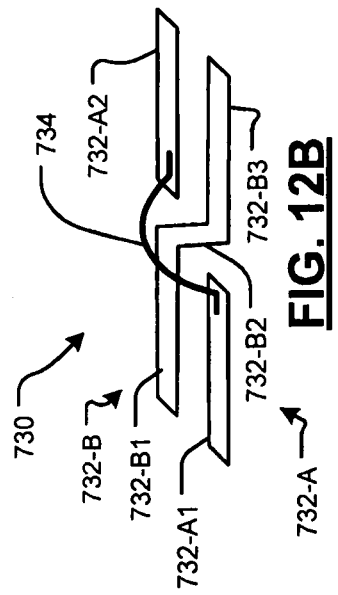
FIGS. 12A-12D illustrates various ways of connecting the leads.
Figure 12A:
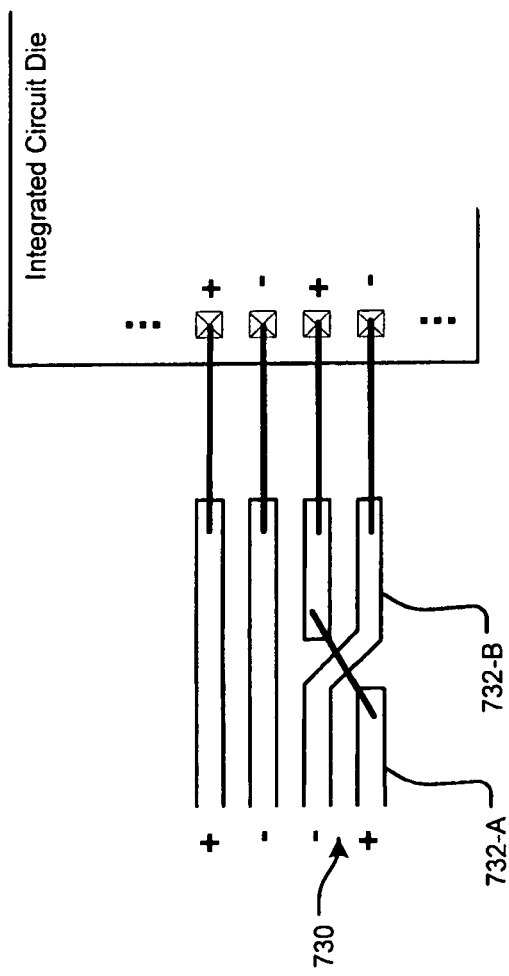

Referring now to FIGS. 12A-12D, various crossover configurations are shown. In FIGS. 12A and 12B, a crossover 730 includes a first lead 732-A that includes a first section 732-A1 and a second section 732-A2 that are connected by a bondwire 734. A second lead 732-B includes a first section 732-B1, a center section 732-B2 and a second section 732-B3. The first section 732-B1 is co-linear with the second section 732-A2. The second section 732-B3 is co-linear with the first section 732-A1. The center section 732-B2 is diagonal relative to the first and second sections 732-B1 and 732-B3. The center section 732-B2 may also be curved.

Figure 12D:
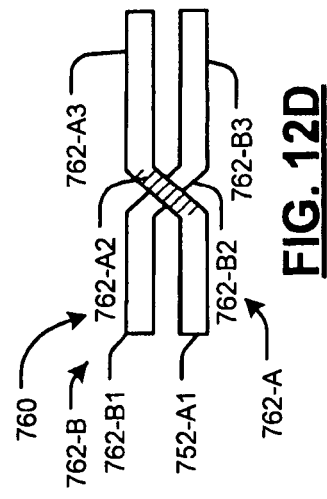
Figure 12C:
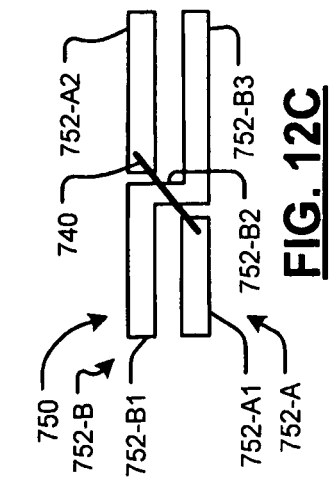

In FIG. 12C, a crossover 750 includes a first lead 752-A that includes a first section 752-A1 and a second section 752-A2 that are connected by a bondwire 740. A second lead 752-B has a first section 752-B1, a center section 752-B2 and a second 752-B3. The first section 752-B1 is co-linear with the second section 752-A2. The second section 752-B3 is co-linear with the first section 752-A1. The center section 752-B2 perpendicular to the first and second straight sections 752-B1 and 752-B3. The center section may also have other suitable shapes.

In FIG. 12D, a pair of leads 760 includes first and second leads 762 and 764 that both have first (labeled-1), center (labeled-2) and second (labeled-3) sections. The center section of at least one lead is curved in a direction perpendicular to a plane containing the leads to provide clearance for the other lead that passes under or over. The center section 764-2 curves upwardly and back downwardly to provide clearance for the center section 762-2 which is planar. Still other variations are contemplated for the crossover.

Referring now to FIGS. 13A and 13B, various packaging techniques are shown. In FIG. 13A, a side view of integrated circuit packaging 800 including a ball grid array substrate is shown. The packaging 800 includes an integrated circuit die 801. Packaging material can be used to protect one or more components of the package 800. An interconnection 802 such as bondwires, flip chips, and/or Tape Automated Bonding (TAB) may be used to connect the integrated circuit die 801 to a ball grid array substrate 804. Solder bumps 806 on the ball grid array substrate 804 are aligned with mounting pads 810 of a printed circuit board 812 or other substrate or mounting surface. In FIG. 13B, integrated circuit packaging 815 includes a flip chip or integrated circuit die 816 that is attached to the substrate 804. The substrate 804 may include mounting pads 818 that align with solder balls 817 of the flip chip 816.

Referring now to FIG. 13C, a more detailed cross sectional view of one exemplary BGA packaging approach 830 is shown. A ball grid array substrate 834 includes a copper patterned layer 835, which defines traces, vias and mounting pads on one or both sides of a substrate core 840. Bondwires 854 may be used to connect one or more traces or mounting pads 849 to a mounting pad 850 on the integrated circuit die 848. Vias 837 provide a connection to the opposite side of the BGA substrate 834. Mounting pads 853 on a bottom surface of the BGA substrate are defined by the copper patterned layer and receive solder bumps 844. A masking layer 838 having a solder mask 855 may be applied to the copper layers 836. A crossover or jumper is integrated with the BGA substrate according to the present invention as will be described below.

Referring now to FIG. 14A, a plan view illustrating a BGA jumper 870 for high speed traces 874, 876 and 878 is shown. The trace 874 comprises a first section 874-1, a second section 874-2 and a third section 874-3 (collectively trace 874). The traces 876 and 878 are connected by vias 880 and 882 to an opposite side of the BGA substrate 834. A crossover trace 883 on an opposite surface of the BGA substrate 834 connects the vias 880 and 882. The crossover trace 883 may be created by adding a buildup layer on a bottom surface of the BGA substrate. As can be appreciated, the crossover traces may have other shapes and/or configurations as described above.

Referring now to FIG. 14B, a simplified cross sectional view illustrating the BGA jumper 870, which has a substrate 908, is shown. The vias 880 and 882 are collectively identified at 910. The vias 910 provide a connection between traces 876 and 878 (collectively identified at 904) and the trace or jumper 883.

Referring now to FIGS. 15A-15C, a simplified cross sectional view illustrating an alternate BGA substrate 930 is shown. Crossover traces such as those shown in FIG. 14A are formed in an interconnect and trace plane 934. In FIG. 15A, the BGA substrate 930 includes I&TP 934, a power plane 938 and a ground plane 942. A substrate core material 946 and/or other insulating layers may be located between the I&TP 934, the power plane 938 and the ground plane 942. In FIG. 15A, vias 950 provide a connection to a crossover jumper or trace 954 that is coplanar with but isolated from the ground plane layer 942. The trace 954 is isolated from the remaining portions of ground plane layer 942. As can be appreciated, the structure shown and described in FIG. 15A eliminates the need for the buildup layer or trace 883 in FIG. 14A.

In FIG. 15B, vias 960 provide a connection to a crossover jumper or trace 964 that is coplanar with but isolated from the power plane layer 938. The trace 964 is isolated from the remaining portions of power plane layer 938. In FIG. 15C, the jumper or trace 964 is shown in the power plane 938. Substrate core material or other insulating material may be used at 970 to insulate the jumper or trace 964 from the power plane 938. Vias 960-1 and 960-2 connect to the jumper or trace 964.

Figure 2:
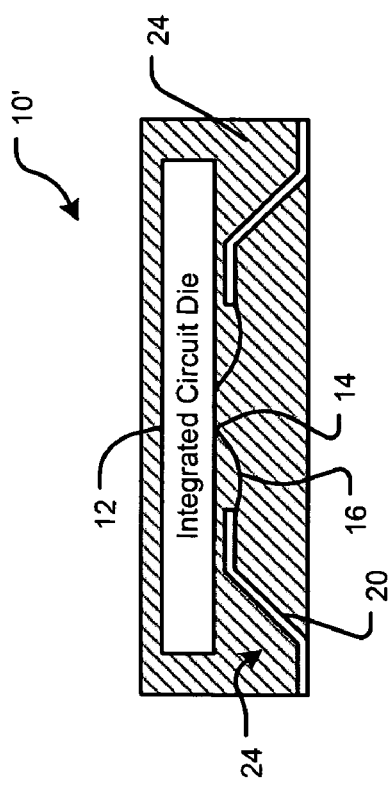
FIG. 2 is a side cross sectional view of a second exemplary package, an IC, bondwires, and leads of a lead frame according to the prior art.
Figure 3:
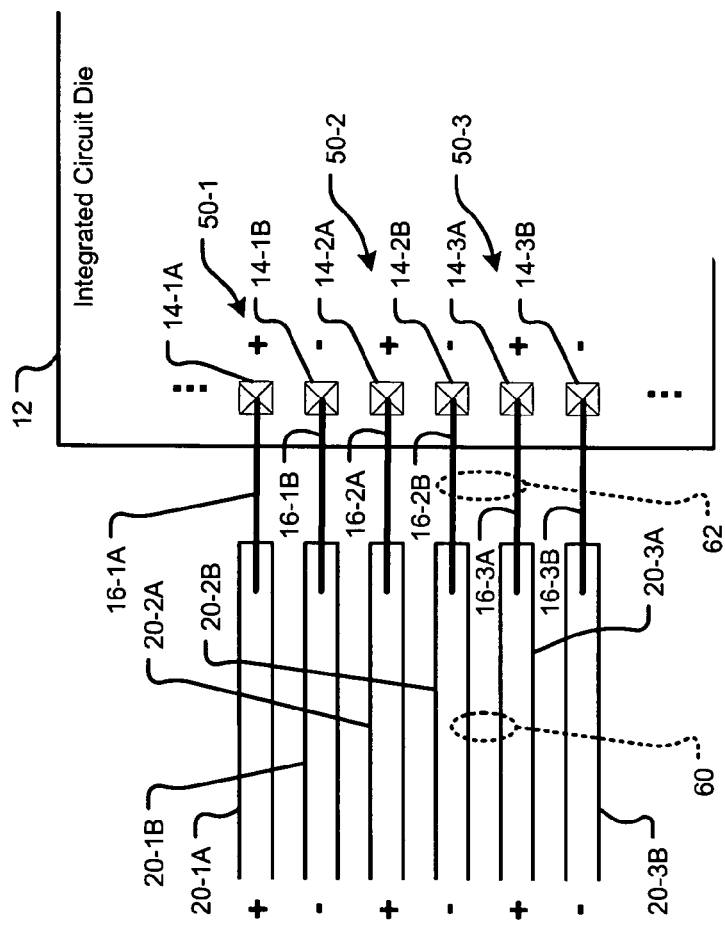
FIG. 3 is a partial plan view of differential signal pairs connected by leads of a lead frame and bondwires to pads of the IC according to the prior art.

Any of the embodiments shown above may be encased by a protective material as shown FIGS. 1 and 2. Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. An integrated circuit package comprising:
   an integrated circuit die comprising N adjacent pads, where N is an integer greater than three;
   a substrate comprising a first pair of traces including first and second traces and a second pair of traces including third and fourth traces,
   wherein said first, second, third and fourth traces include first ends that are spaced from said integrated circuit die and second ends that are adjacent to said integrated circuit die, wherein said first and second pairs of traces carry differential signals, wherein said third trace of said second pair of traces has a first polarity and said fourth trace of said second pair of traces has a second polarity, and wherein said third trace is located on one side of said fourth trace at said first end and is located on an opposite side of said fourth trace at said second end, wherein said third trace crosses said fourth trace, and wherein said fourth trace comprises a middle section that communicates with said first and second ends of said fourth trace through first and second vias; and
   N connections that independently connect said second ends to N pads.

2. The integrated circuit package of claim 1 wherein said N connections comprise N bondwires that connect said second ends to said N pads.

3. The integrated circuit package of claim 2 further comprising a serializer/deserializer (SERDES) module that communicates with said N pads.

4. The integrated circuit package of claim 2 wherein at least one of said N bondwires comprises first and second bondwires that are stacked and connected between at least one of said first, second, third and fourth traces and at least one of said N pads of said integrated circuit die.

5. The integrated circuit package of claim 1 wherein said fourth trace is segmented.

6. The integrated circuit package of claim 5 wherein said fourth trace comprises first and second segments, said first via that passes through said substrate and communicates with said first segment, said second via that passes through said substrate and communicates with said second segment, and said middle section comprising a trace on an opposite side of said substrate that communicates with said first and second vias.

7. The integrated circuit package of claim 6 wherein said third trace comprises a first section, a second section and a middle crossover section that connects said first and second sections.

8. The integrated circuit package of claim 7 wherein said first section is co-linear with said first segment and said second section is co-linear with said second segment.

9. The integrated circuit package of claim 1 wherein said first and second pairs of traces of said substrate carry high speed differential signals.

10. The integrated circuit package of claim 9 wherein said high speed differential signals have a frequency greater than or equal to 1 Gigabit per second (Gb/s).

11. The integrated circuit package of claim 1 wherein said second ends of said first and second pairs of traces are spaced at least a first distance from said integrated circuit die and said substrate further comprises fifth and sixth traces that are spaced a second distance from said integrated circuit die, wherein said first distance is greater than said second distance.

12. A network interface comprising the integrated circuit package of claim 1.

13. The network interface of claim 12 wherein said network interface is Ethernet compliant and operates at speeds greater than 1 Gigabit per second.

14. An integrated circuit package comprising:
   an integrated circuit die comprising N adjacent pads, where N is an integer greater than three;
   a substrate comprising a first pair of traces including first and second traces and a second pair of traces including third and fourth traces,
   wherein said first, second, third and fourth traces include first ends that are spaced from said integrated circuit die and second ends that are adjacent to said integrated circuit die, wherein said first and second pairs of traces carry differential signals, wherein said third trace of said second pair of traces has a first polarity and said fourth trace of said second pair of traces has a second polarity, and wherein said third trace is located on one side of said fourth trace at said first end and is located on an opposite side of said fourth trace at said second end; and
   N connections that independently connect said second ends to N pads, wherein said third trace crosses said fourth trace, wherein said second end of said third trace is located between said second ends of said fourth trace and said second trace, wherein said third trace crosses said fourth trace, and wherein said fourth trace comprises a middle section that communicates with said first and second ends of said fourth trace through first and second vias.

15. An integrated circuit package comprising:
   an integrated circuit die comprising N adjacent pads, where N is an integer greater than three;
   a substrate comprising a first pair of traces including first and second traces and a second pair of traces including third and fourth traces,
   wherein said first, second, third and fourth traces include first ends that are spaced from said integrated circuit die and second ends that are adjacent to said integrated circuit die, wherein said first and second pairs of traces carry differential signals, wherein said third trace of said second pair of traces has a first polarity and said fourth trace of said second pair of traces has a second polarity, and wherein said third trace is located on one side of said fourth trace at said first end and is located on an opposite side of said fourth trace at said second end; and N connections that independently connect said second ends to N pads, wherein said third trace crosses said fourth trace, wherein said N connections comprise N bondwires that connect said second ends to said N pads, wherein said second end of said fourth trace is located between said second ends of said third trace and said second trace, wherein said third trace crosses said fourth trace, and wherein said fourth trace comprises a middle section that communicates with said first and second ends of said fourth trace through first and second vias.

16. An integrated circuit package comprising:

an integrated circuit die comprising N adjacent pads, where N is an integer greater than three;

a substrate comprising a first pair of traces including first and second traces and a second pair of traces including third and fourth traces, wherein said first, second, third and fourth traces include first ends that are spaced from said integrated circuit die and second ends that are adjacent to said integrated circuit die, wherein said first and second pairs of traces carry differential signals, wherein said third trace of said second pair of traces has a first polarity and said fourth trace of said second pair of traces has a second polarity, wherein said third trace is located on one side of said fourth trace at said first end and is located on an opposite side of said fourth trace at said second end, wherein said third trace crosses said fourth trace, wherein said third trace crosses said fourth trace, and wherein said fourth trace comprises a middle section that communicates with said first and second ends of said fourth trace through first and second vias.

N connections that independently connect said second ends to N pads;

fifth and sixth traces;

fifth and sixth pads on said integrated circuit die; and fifth and sixth bondwires connecting said fifth and sixth traces to said fifth and sixth pads, wherein said N bondwires have a first length and said fifth and sixth bondwires have a second length that is shorter than said first length.

17. An integrated circuit package comprising:

an integrated circuit die comprising N adjacent pads, where N is an integer greater than three;

a substrate comprising a first pair of traces including first and second traces and a second pair of traces including third and fourth traces, wherein said first, second, third and fourth traces include first ends that are spaced from said integrated circuit die and second ends that are adjacent to said integrated circuit die, wherein said first and second pairs of traces carry differential signals, wherein said third trace of said second pair of traces has a first polarity and said fourth trace of said second pair of traces has a second polarity, wherein said third trace is located on one side of said fourth trace at said first end and is located on an opposite side of said fourth trace at said second end, wherein said third trace crosses said fourth trace, and wherein said fourth trace comprises a middle section that communicates with said first and second ends of said fourth trace through first and second vias; and N connections that independently connect said second ends to N pads, wherein fifth and sixth traces carry signals having a first speed and wherein said first and second pairs of traces carry signals having a second speed that is higher than said first speed.

18. An integrated circuit package comprising:

an integrated circuit die comprising N adjacent pads, where N is an integer greater than three;

a substrate comprising a first pair of traces including first and second traces and a second pair of traces including third and fourth traces, wherein said first, second, third and fourth traces include first ends that are spaced from said integrated circuit die and second ends that are adjacent to said integrated circuit die, wherein said first and second pairs of traces carry differential signals, wherein said third trace of said second pair of traces has a first polarity and said fourth trace of said second pair of traces has a second polarity, and wherein said third trace is located on one side of said fourth trace at said first end and is located on an opposite side of said fourth trace at said second end; and N connections that independently connect said second ends to N pads, wherein said substrate includes a first conductive plane and wherein said fourth trace comprises first and second trace segments, a first via that passes through said substrate to said first conductive plane and communicates with said first segment, a second via that passes through said substrate to said first conductive plane and communicates with said second segment, and jumper that is coplanar with and isolated from said first conductive plane and that communicates with said first and second vias.

19. The integrated circuit package of claim 18 wherein said first conductive plane includes one of a ground plane, a signal plane and a power plane.

20. A method of providing an integrated circuit package comprising:

providing N adjacent pads on an integrated circuit die, where N is an integer greater than three;

providing a substrate comprising a first pair of traces including first and second traces and a second pair of traces including third and fourth traces, locating first ends of said first, second, third and fourth traces spaced from said integrated circuit die;

locating second ends of said first, second, third and fourth traces adjacent to said integrated circuit die;

carrying differential signals using said first and second pairs of traces, wherein said third trace of said second pair of traces has a first polarity and said fourth trace of said second pair of traces has a second polarity;

locating said third trace on one side of said fourth trace at said first end;

locating said third trace on an opposite side of said fourth trace at said second end, wherein said third trace crosses said fourth trace, and wherein said fourth trace comprises a middle section that communicates with said first and second ends of said fourth trace through first and second vias; and independently connecting said second ends to N pads.

21. The method of claim 20 using N bondwires to connect said second ends to said N pads.

22. The method of claim 21 further comprising:

providing fifth and sixth traces;

providing fifth and sixth pads on said integrated circuit die;

using fifth and sixth bondwires connecting said fifth and sixth traces to said fifth and sixth pads, wherein said N bondwires have a first length and said fifth and sixth bondwires have a second length that is shorter than said first length.

23. The method of claim 21 further comprising a serializer/deserializer (SERDES) module that communicates with said N pads.

24. The method of claim 21 wherein at least one of said N bondwires comprises first and second bondwires that are stacked and connected between at least one of said first, second, third and fourth traces and at least one of said N pads of said integrated circuit die.

25. The method of claim 20 wherein said fourth trace is segmented.

26. The method of claim 25 wherein said fourth trace comprises first and second segments, said first via that passes through said substrate and communicates with said first segment, said second via that passes through said substrate and communicates with said second segment, and said middle section comprising a trace on an opposite side of said substrate that communicates with said first and second vias.

27. The method of claim 26 wherein said third trace comprises a first section, a second section and a middle crossover section that connects said first and second sections.

28. The method of claim 27 wherein said first section is co-linear with said first segment and said second section is co-linear with said second segment.

29. The method of claim 20 further comprising carrying high speed differential signals using said first and second pairs of traces of said substrate.

30. The method of claim 29 wherein said high speed differential signals have a frequency greater than or equal to 1 Gigabit per second (Gb/s).

31. The method of claim 20 further comprising:
spacing said second ends of said first and second pairs of traces at least a first distance from said integrated circuit die; and
providing fifth and sixth traces that are spaced a second distance from said integrated circuit die, wherein said first distance is greater than said second distance.

32. The method of claim 31 further comprising:
using said fifth and sixth traces to carry signals having a first speed; and
using said first and second pairs of traces to carry signals having a second speed that is higher than said first speed.

33. The method of claim 20 further comprising implementing a network interface on said integrated circuit die that is Ethernet compliant and operates at speeds greater than 1 Gigabit per second.

34. A method of providing an integrated circuit package comprising:
providing N adjacent pads on an integrated circuit die, where N is an integer greater than three;
providing a substrate comprising a first pair of traces including first and second traces and a second pair of traces including third and fourth traces,
locating first ends of said first, second, third and fourth traces spaced from said integrated circuit die;
locating second ends of said first, second, third and fourth traces adjacent to said integrated circuit die;
carrying differential signals using said first and second pairs of traces, wherein said third trace of said second pair of traces has a first polarity and said fourth trace of said second pair of traces has a second polarity;
locating said third trace on one side of said fourth trace at said first end;
locating said third trace on an opposite side of said fourth trace at said second end; and
independently connecting said second ends to N pads, wherein said third trace crosses said fourth trace, wherein said fourth trace is segmented, wherein said second end of said third trace is located between said second ends of said fourth trace and said second trace, wherein said third trace crosses said fourth trace, and wherein said fourth trace comprises a middle section that communicates with said first and second ends of said fourth trace through first and second vias.

35. A method of providing an integrated circuit package comprising:
providing N adjacent cads on an integrated circuit die, where N is an integer greater than three;
providing a substrate comprising a first pair of traces including first and second traces and a second pair of traces including third and fourth traces,
locating first ends of said first, second, third and fourth traces spaced from said integrated circuit die;
locating second ends of said first, second, third and fourth traces adjacent to said integrated circuit die;
carrying differential signals using said first and second pairs of traces, wherein said third trace of said second pair of traces has a first polarity and said fourth trace of said second pair of traces has a second polarity;
locating said third trace on one side of said fourth trace at said first end;
locating said third trace on an opposite side of said fourth trace at said second end; and
independently connecting said second ends to N pads, wherein said third trace crosses said fourth trace, wherein said fourth trace is segmented, wherein said second end of said fourth trace is located between said second ends of said third trace and said second trace, wherein said third trace crosses said fourth trace, and wherein said fourth trace comprises a middle section that communicates with said first and second ends of said fourth trace through first and second vias.

36. A method of providing an integrated circuit package comprising:
providing N adjacent pads on an integrated circuit die, where N is an integer greater than three;
providing a substrate comprising a first pair of traces including first and second traces and a second pair of traces including third and fourth traces,
locating first ends of said first, second, third and fourth traces spaced from said integrated circuit die;
locating second ends of said first, second, third and fourth traces adjacent to said integrated circuit die;
carrying differential signals using said first and second pairs of traces, wherein said third trace of said second pair of traces has a first polarity and said fourth trace of said second pair of traces has a second polarity;
locating said third trace on one side of said fourth trace at said first end;
locating said third trace on an opposite side of said fourth trace at said second end; and
independently connecting said second ends to N pads, wherein said substrate includes a first conductive plane and wherein said fourth trace comprises first and second trace segments, a first via that passes through said substrate to said first conductive plane and communicates with said first segment, a second via that passes through said substrate to said first conductive plane and communicates with said second segment, and jumper that is coplanar with and isolated from said first conductive plane and that communicates with said first and second visa.

37. The method of claim 36 wherein said first conductive plane includes one of a ground plane, a signal plane and a power plane.

* * * * *